(12) United States Patent
Rusanovskyy et al.

(10) Patent No.: US 12,284,386 B2
(45) Date of Patent: *Apr. 22, 2025

(54) LOW COMPLEXITY HISTORY USAGE FOR RICE PARAMETER DERIVATION FOR HIGH BIT-DEPTH VIDEO CODING

(71) Applicant: QUALCOMM Incorporated, San Diego, CA (US)

(72) Inventors: Dmytro Rusanovskyy, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,611

(22) Filed: Jun. 29, 2023

(65) Prior Publication Data

US 2023/0353785 A1    Nov. 2, 2023

Related U.S. Application Data

(63) Continuation of application No. 17/645,187, filed on Dec. 20, 2021, now Pat. No. 11,736,727.

(Continued)

(51) Int. Cl.
*H04N 19/60* (2014.01)
*H04N 19/12* (2014.01)
(Continued)

(52) U.S. Cl.
CPC ............. *H04N 19/60* (2014.11); *H04N 19/12* (2014.11); *H04N 19/124* (2014.11);
(Continued)

(58) Field of Classification Search
CPC ...... H04N 19/60; H04N 19/12; H04N 19/124; H04N 19/174; H04N 19/176; H04N 19/18; H04N 19/197; H04N 19/70
(Continued)

(56) References Cited

U.S. PATENT DOCUMENTS 10,616,604 B2    4/2020  Zhang et al.
11,616,962 B2    3/2023  Xu et al.
(Continued)

FOREIGN PATENT DOCUMENTS

EP    4024868 A1    7/2022
EP    4024869 A1    7/2022
(Continued)

OTHER PUBLICATIONS

Bossen F., et al., "VVC Operation Range Extensions (Draft 4)," JVET-W2005-v2, Joint Video Experts Team (JVET) of ITU-T SG 16 WP 3 and ISO/IEC JTC 1/SC 29, 23rd Meeting, by teleconference, Jul. 7-16, 2021, pp. 1-31.

(Continued)

*Primary Examiner* — Dominic D Saltarelli
(74) *Attorney, Agent, or Firm* — Shumaker & Sieffert, P. A.

(57) ABSTRACT

A method of decoding video data comprises updating a coefficient statistic value based on one or more transform coefficients of a transform block (TB), wherein updating the coefficient statistic value comprises, for each respective transform coefficient of the one or more transform coefficients of the TB: performing a derivation process to determine a temporary value, wherein the derivation process is determined based at least in part on which encoding procedure of a plurality of encoding procedures is used to encode the respective transform coefficient, the plurality of encoding procedures including a context-based procedure for (Continued)

encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB.

20 Claims, 10 Drawing Sheets

Related U.S. Application Data

(60) Provisional application No. 63/128,641, filed on Dec. 21, 2020.

(51) Int. Cl.
| | |
|---|---|
| *H04N 19/124* | (2014.01) |
| *H04N 19/174* | (2014.01) |
| *H04N 19/176* | (2014.01) |
| *H04N 19/18* | (2014.01) |
| *H04N 19/196* | (2014.01) |
| *H04N 19/70* | (2014.01) |

(52) U.S. Cl.
CPC ......... *H04N 19/174* (2014.11); *H04N 19/176* (2014.11); *H04N 19/18* (2014.11); *H04N 19/197* (2014.11); *H04N 19/70* (2014.11)

(58) Field of Classification Search
USPC ..................................................... 375/240.03
See application file for complete search history.

(56) References Cited

U.S. PATENT DOCUMENTS

| | | | |
|---|---|---|---|
| 2016/0234498 | A1 | 8/2016 | Misra et al. |
| 2021/0084303 | A1* | 3/2021 | Sarwer ................. H04N 19/122 |
| 2021/0168370 | A1 | 6/2021 | Yoo et al. |
| 2021/0203963 | A1 | 7/2021 | Wang et al. |
| 2022/0201332 | A1 | 6/2022 | Rusanovskyy et al. |
| 2022/0337811 | A1* | 10/2022 | Choi .................... H04N 19/176 |
| 2023/0041808 | A1 | 2/2023 | Chen et al. |

FOREIGN PATENT DOCUMENTS

| | | |
|---|---|---|
| EP | 4029257 A1 | 7/2022 |
| WO | WO-2020197751 A1 | 10/2020 |
| WO | 2021159081 A1 | 8/2021 |

OTHER PUBLICATIONS

Bross B., et al., "Versatile Video Coding (Draft 10)", Joint Video Experts Team (JVET) of ITU-T SG 16 WP 3 and ISO/IEC JTC 1/SC 29/WG 11, 131, MPEG Meeting, 19th Meeting, by Teleconference, Jun. 22-Jul. 1, 2020, Jun. 29, 2020-Jul. 3, 2020, Online, (Motion Picture Expert Group or ISO/IEC JTC1/SC29/WG11), No. JVET-S2001-vH, Version 17, Sep. 4, 2020, XP030293002, 548 Pages.
Bross B., et al., "Versatile Video Coding Editorial Refinements on Draft 10", JVET-T2001-v2, 20. JVET Meeting, Oct. 7, 2020-Oct. 16, 2020, Teleconference, (The Joint Video Experts Team of ISO/IEC JTC1/SC29/WG11 and ITU-T SG 16), Nov. 24, 2020 (Nov. 24, 2020), pp. 1-515, XP030293334, cited in the application section 9.3.3.2.
Browne A., et al., "AHG12: Rice Parameter Selection for High Bit Depths", JVET-T0072, 20. JVET Meeting, Oct. 7, 2020-Oct. 16, 2020, Teleconference, (The Joint Video Experts Team of ISO/IEC JTC1/SC29/WG11 and ITU-T SG 16), Oct. 12, 2020 (Oct. 12, 2020), 15 Pages, XP030293494, the whole document.
Browne A., et al., "CE on Entropy Coding for High Bit Depth and High Bit Rate Coding," JVET-U2022, Joint Video Experts Team (JVET) of ITU-T SG 16 WP 3 and ISO/IEC JTC 1/SC 29, 21st Meeting, by teleconference, Jan. 6-15, 2021, pp. 1-10.
Browne A., et al., "Common Test Conditions for High Bit Depth and High Bit Rate Video Coding", JVET-U2018-v2, Joint Video Experts Team (JVET) of ITU-T SG 16 WP 3 and ISO/IEC JTC 1/SC 29, 21st Meeting, by Teleconference, Jan. 6-15, 2021, pp. 1-8.
International Search Report and Written Opinion—PCT/US2021/073060—ISA/EPO—Apr. 13, 2022.
ITU-T H.265: "Series H: Audiovisual and Multimedia Systems Infrastructure of Audiovisual Services—Coding of Moving Video", High Efficiency Video Coding, The International Telecommunication Union, Jun. 2019, 696 Pages.
ITU-T H.266: "Series H: Audiovisual and Multimedia Systems Infrastructure of Audiovisual Services—Coding of Moving Video", Versatile Video Coding, The International Telecommunication Union, Aug. 2020, 516 pages.
Rosewarne C., et al., "High Efficiency Video Coding (HEVC) Test Model 16 (HM 16) Improved Encoder Description Update 14", JCTVC-AN1002, Joint Collaborative Team on Video Coding (JCT-VC) of ITU-T SG16 WP3 and ISO/IEC JTC1/SC29/WG11, 40th Meeting, by Teleconference, Jun. 24-Jul. 1, 2020, 131. MPEG Meeting, Jun. 29, 2020-Jul. 3, 2020, Online, (Motion Picture Expert Group or ISO/IEC JTC1/SC29/WG11), No. n19473, Coding of moving pictures and audio, Oct. 10, 2020 (Oct. 10, 2020), 79 Pages, XP030292239, section 4.8.3.
Rusanovskyy D., et al., "CE-3.4: Combination of CE-1.2 and CE-2.1," JVET-U0065, Joint Video Experts Team (JVET), of ITU-T SG 16 WP 3 and ISO/IEC JTC 1/SC 29, 21st Meeting, by teleconference, Jan. 6-15, 2021, pp. 1-5.
Rusanovskyy D., et al., "CE-3.5 and CE-3.6: Combination of CE-1.2, CE-1.4/1.5 and CE-1.3", 21. JVET Meeting, Jan. 6, 2021-Jan. 15, 2021, Teleconference, (The Joint Video Exploration Team of ISO/IEC JTC1/SC29/WG11 and ITU-T SG 16), No. JVET-U0066, Jan. 12, 2021 (Jan. 12, 2021), 10 Pages, XP030293136, the whole document.
Rusanovskyy D., et al., "CE-related: On History-Enhanced Method of Rice Parameter Derivation for Regular Residual Coding (RRC) at High Bit Depths", 22. JVET Meeting, Apr. 20, 2021-Apr. 28, 2021, Teleconference, (The Joint Video Experts Team of ISO/IEC JTC1/SC29/WG11 and ITU-T SG 16 WP 3), No. JVET-V0106, m56518, Apr. 13, 2021 (Apr. 13, 2021), pp. 1-9, XP030294253, the whole document.
Rusanovskyy D., et al., "CE-1.1, CE-1.2 and CE-1.4: On the Rice Parameter Derivation for High Bit-Depth Coding", JVET-V0052, Joint Video Experts Team (JVET) of ITU-T SG 16 WP 3 and ISO/IEC JTC 1/SC 29, 22nd Meeting, by Teleconference, m56433, Apr. 20-28, 2021, pp. 1-21, XP030294053, The whole document.
Van L.P., et al., "AHG12: On the Rice Parameter Derivation for High Bit-Depth Coding", 20. JVET Meeting, Oct. 7, 2020-Oct. 16, 2020, Teleconference, (The Joint Video Experts Team of ISO/IEC JTC1/SC29/WG11 and ITU-T SG 16), JVET-T0105, Oct. 12, 2020 (Oct. 12, 2020), pp. 1-7, XP030293582, Retrieved from the Internet: URL: https://jvet-experts.org/doc_end_user/documents/20_Teleconference/wg11/JVET-T0105-v3.zip, JVET-T0105_r2.docx, [retrieved on Oct. 12, 2020], The whole document, sections 1 and 2.
Van L.P., et al., "AHG12: On the Rice Parameter Derivation for High Bit-Depth Coding", 20. JVET Meeting, Oct. 7, 2020-Oct. 16, 2020, Teleconference, (The Joint Video Experts Team of ISO/IEC JTC1/SC29/WG11 and ITU-T SG 16), JVET-T0105, Oct. 12, 2020 (Oct. 12, 2020), pp. 1-7, XP030293582, the whole document.

* cited by examiner

Position of the current transform coefficient

Position of the neighboring transform coefficients to be used in calculation of *localSumAbs* for the current transform coefficient Position of the current transform coefficient Position of the neighboring transform coefficients to be used in calculation of *localSumAbs* for the current transform coefficient

LOW COMPLEXITY HISTORY USAGE FOR RICE PARAMETER DERIVATION FOR HIGH BIT-DEPTH VIDEO CODING

This application is a continuation of U.S. patent application Ser. No. 17/645,187, filed 20 Dec. 2021, which claims the benefit of U.S. Provisional Patent Application 63/128,641, filed Dec. 21, 2020, the entire content of both being incorporated herein by reference.

TECHNICAL FIELD

This disclosure relates to video encoding and video decoding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video coding techniques, such as those described in the standards defined by MPEG-2, MPEG-4, ITU-T H.263, ITU-T H.264/MPEG-4, Part 10, Advanced Video Coding (AVC), ITU-T H.265/High Efficiency Video Coding (HEVC), and extensions of such standards. The video devices may transmit, receive, encode, decode, and/or store digital video information more efficiently by implementing such video coding techniques.

Video coding techniques include spatial (intra-picture) prediction and/or temporal (inter-picture) prediction to reduce or remove redundancy inherent in video sequences. For block-based video coding, a video slice (e.g., a video picture or a portion of a video picture) may be partitioned into video blocks, which may also be referred to as coding tree units (CTUs), coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

SUMMARY

In general, this disclosure describes techniques for Rice parameter derivation for regular residual coding (RRC) in high bit-depth coding. The proposed techniques are concerned with extensions of a video coding standard (e.g., Versatile Video Coding (VVC)), but may be applicable to other video coding standards. As described herein, a process for updating a coefficient statistic value used in determining Rice parameters for transform coefficients may take into consideration which encoding procedure of a plurality of encoding procedures is used to encode the respective transform coefficient. The plurality of encoding procedures includes a context-based procedure for encoding the respective transform coefficient and encoding the respective transform coefficient as an absolute value. Determining a Rice parameter based at least in part on the encoding procedure used to encode the respective transform coefficient may increase accuracy of selection of the Rice parameter, which may enhance coding efficiency.

In one example, this disclosure describes a method of decoding video data, the method comprising: initializing a coefficient statistic value; updating the coefficient statistic value based on one or more transform coefficients of a transform block (TB) of the video data, wherein updating the coefficient statistic value comprises, for each respective transform coefficient of the one or more transform coefficients of the TB: performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; determining a level of the specific transform coefficient based on the Rice parameter for the specific transform coefficient and one or more syntax elements encoded in a bitstream; and decoding the TB based on the level of the specific transform coefficient.

In another example, this disclosure describes a method of encoding video data, the method comprising: initializing a coefficient statistic value; updating the coefficient statistic value based on one or more transform coefficients of a transform block (TB) of the video data, wherein updating the coefficient statistic value comprises, for each respective transform coefficient of the one or more transform coefficients of the TB: performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; and generating a Rice code for the specific transform coefficient based on the Rice parameter for the specific transform coefficient and a level of the specific transform coefficient.

In another example, this disclosure describes a device for decoding video data, the device comprising: a memory configured to store the video data; and processing circuitry configured to: initialize a coefficient statistic value; update the coefficient statistic value based on one or more transform coefficients of a transform block (TB) of a block of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; determine a level of the specific transform coefficient based on the Rice parameter for the specific transform coefficient; and decode the block based on the level of the specific transform coefficient.

In another example, this disclosure describes a device for encoding video data, the device comprising: a memory configured to store the video data; and processing circuitry configured to: initialize a coefficient statistic value; update the coefficient statistic value based on one or more transform coefficients of a transform block (TB) of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; and generate a Rice code for the specific transform coefficient based on the Rice parameter for the specific transform coefficient and a level of the specific transform coefficient.

In another example, this disclosure describes a device for decoding video data, the device comprising: means for initializing a coefficient statistic value; means for updating the coefficient statistic value based on one or more transform coefficients of a transform block (TB) of a block of the video data, wherein the means for updating the coefficient statistic value comprises, for each respective transform coefficient of the one or more transform coefficients of the TB: means for performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and means for setting the coefficient statistic value as an average of the coefficient statistic value and the temporary value; means for determining a history value based on the coefficient statistic value; means for determining a Rice parameter for a specific transform coefficient of the TB, wherein the means for determining the Rice parameter comprises, for the specific transform coefficient: means for determining, based on the specific transform coefficient being less than three spatial positions away from a right border of the TB or a bottom border of the TB, a local sum value based on the history value; and means for determining the Rice parameter for the specific transform coefficient based on the local sum value; means for determining a level of the specific transform coefficient based on the Rice parameter for the specific transform coefficient; and means for decoding the block based on the level of the specific transform coefficient.

In another example, this disclosure describes a device for encoding video data, the device comprising: means for initializing a coefficient statistic value; means for updating the coefficient statistic value based on one or more transform coefficients of a transform block (TB) of the video data, wherein the means for updating the coefficient statistic value comprises, for each respective transform coefficient of the one or more transform coefficients of the TB: means for performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and means for setting the coefficient statistic value as an average of the coefficient statistic value and the temporary value; means for determining a history value based on the coefficient statistic value; means for determining a Rice parameter for a specific transform coefficient of the TB, wherein the means for determining the Rice parameter comprises, for the specific transform coefficient: means for determining, based on the specific transform coefficient being less than three spatial positions away from a right border of the TB or a bottom border of the TB, a local sum value based on the history value; and means for determining the Rice parameter for the specific transform coefficient based on the local sum value; and means for generating a Rice code for the specific transform coefficient based on the Rice parameter for the specific transform coefficient and a level of the specific transform coefficient.

In another example, this disclosure describes a computer-readable storage medium having instructions stored thereon that, when executed, cause one or more processors to: initialize a coefficient statistic value; update the coefficient statistic value based on one or more transform coefficients of a transform block (TB) of a block of video data, wherein the instructions that cause the one or more processors to update the coefficient statistic value comprises instructions that, when executed, cause the one or more processors to, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the instructions that cause the one or more processors to determine the Rice parameter for the specific transform coefficient comprises instructions that, when executed, cause the one or more processors to: based on the specific transform coefficient being less than three spatial positions away from a right border of the TB or a bottom border of the TB, determine a local sum value based on the history value; and determine the Rice parameter for the specific transform coefficient based on the local sum value; determine a level of the specific transform coefficient based on the Rice parameter for the specific transform coefficient and one or more syntax elements encoded in a bitstream; and decode the block based on the level of the specific transform coefficient.

In another example, this disclosure describes a computer-readable storage medium having instructions stored thereon that, when executed, cause one or more processors to: initialize a coefficient statistic value; update the coefficient statistic value based on one or more transform coefficients of a transform block (TB) of video data, wherein the instructions that cause the one or more processors to update the coefficient statistic value comprises instructions that, when executed, cause the one or more processors to, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the instructions that cause the one or more processors to determine the Rice parameter for the specific transform coefficient comprises instructions that, when executed, cause the one or more processors to: based on the specific transform coefficient being less than three spatial positions away from a right border of the TB or a bottom border of the TB, determine a local sum value based on the history value; and determine the Rice parameter for the specific transform coefficient based on the local sum value; and generate a Rice code for the specific transform coefficient based on the Rice parameter for the specific transform coefficient and a level of the specific transform coefficient.

The details of one or more examples are set forth in the accompanying drawings and the description below. Other features, objects, and advantages will be apparent from the description, drawings, and claims.

DETAILED DESCRIPTION

Figure 1:
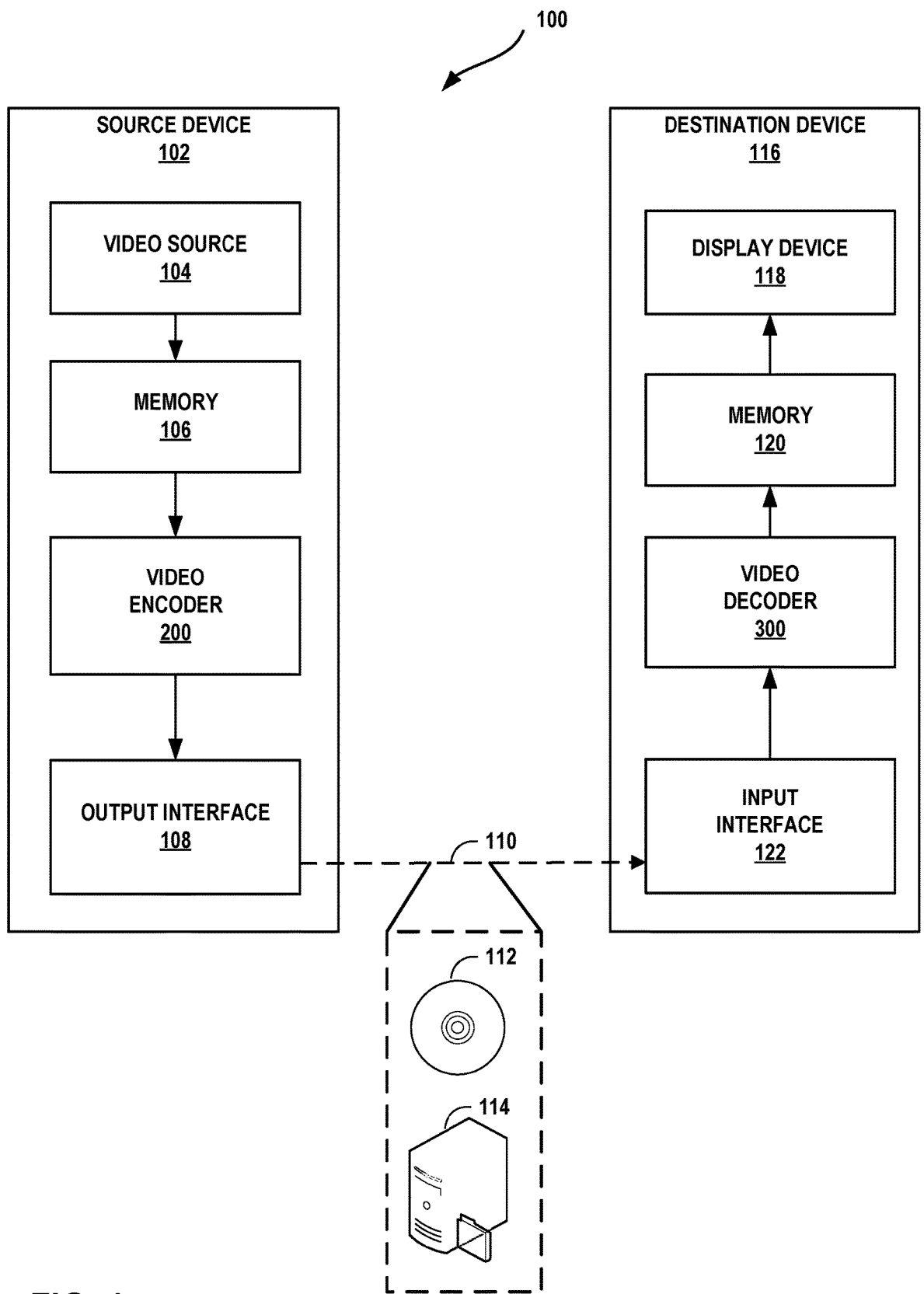
FIG. 1 is a block diagram illustrating an example video encoding and decoding system that may perform the techniques of this disclosure.

In video coding standards such as Versatile Video Coding (VVC), a video encoder generates residual samples. The residual samples may indicate differences between predicted samples of a block and the original samples of the block. The video encoder may then apply a transform (e.g., a discrete cosine transform) to a block (e.g., a transform block (TB)) of the residual samples to generate transform coefficients. Each transform coefficient may be represented in the form of one or more syntax elements. In some examples, a transform coefficient may be encoded using a context-based procedure (e.g., method) in which a level of the transform coefficient may be represented using a sign syntax element, a greater-than-1 syntax element, a greater-than-2 syntax element, and a remainder syntax element. In some examples, a transform coefficient may be encoded using an absolute value syntax element (e.g., dec_abs_level). The remainder syntax element or absolute value typically includes the most bits.

The video encoder may use Rice coding to encode a remainder syntax element or an absolute value syntax element. Rice coding is a process in which an input value (e.g., the value of a remainder syntax element) is used to generate a Rice code that includes a prefix value and a suffix value. The prefix value may be generated as:

$$q = \left\lfloor \frac{x}{M} \right\rfloor,$$

where q is the prefix, x is the input value and M is equal to $2^k$, and k is a Rice parameter. The suffix value may be generated as: r=x−qM, where r is the suffix.

Different values of the Rice parameter may be advantageous in different situations. Accordingly, VVC provides a process for determining a Rice parameter to use when performing Rice coding on a remainder syntax element or an absolute value syntax element. Specifically, a local sum value (e.g., locSumAbs) may be determined by summing the absolute values of five neighboring transform coefficients. The term "locSumAbs" may be used interchangeably with "localSumAbs." The positions of the five neighboring transform coefficients are defined by a template. The local sum value may then be used as an index to look up a Rice parameter in a table. However, when, for example, the high bit depth extension of VVC is being used, certain modifications may be needed because the local sum value may be greater than the maximum index value defined in the table.

Another complicating aspect of determining the Rice parameter is that the current transform coefficient may be less than three rows or columns of a right and bottom border of the current TB. Attempting to use neighboring transform coefficients defined by the template may reduce the accuracy of the process to determine the Rice parameter for the current transform coefficient. To address this, VVC defines a history-based procedure for determining the Rice parameter for the current TB. When using the history-based procedure to determine a Rice parameter for a current transform coefficient in a current Rice class of a current TB, the video coder may use a history value (e.g., histCoeff) as the value of a neighbor transform coefficient that is within two positions of the right or bottom border of the current TB.

To use the history-based procedure, a video coder (e.g., a video encoder or a video decoder) may initialize a coefficient statistic value (e.g., statCoeff) and update the coefficient based on one or more transform coefficients of the current TB. The video coder may determine the history value based on the coefficient statistic value.

However, as noted above, transform coefficients may be encoded using a context-based procedure or using absolute values. Updating the coefficient statistic value in the same way despite the possibility of transform coefficients being encoded using the context-based procedure or using absolute values may diminish performance and may lead to selection of incorrect Rice parameters. In accordance with one or more techniques of this disclosure, a video coder (e.g., a video encoder or a video decoder) may update a coefficient statistic value based on one or more transform coefficients of a TB of the video data. As part of updating the coefficient statistic value, the video coder may, for each respective transform coefficient of the one or more transform coefficients of the TB, perform a derivation process to determine a temporary value. The derivation process takes into consideration (i.e., is determined based at least in part on) which encoding procedure of a plurality of encoding procedures is used to encode the respective transform coefficient. The plurality of encoding procedures including the context-based procedure for encoding the respective transform coefficient and encoding the respective transform coefficient as an absolute value. The video coder may set the coefficient statistic value as an average of the coefficient statistic value and the temporary value. Because the derivation process is determined based at least in part on which encoding procedure is used to encode the respective transform coefficient, the video coder is more likely to determine an optimal Rice parameter for the respective transform coefficient. The video coder may be more likely to determine an optimal Rice parameter for the respective transform coefficient because VVC defines a "hybrid" procedure for coding regular residual coefficients (RRC). In this "hybrid" procedure, depending on the mode, the video coder may CABAC code RRC either in a bypass mode (i.e., an Exponential-Golomb procedure with number of bits to represent coefficients is dependent on the Rice parameter derived from a local template processing) or may CABAC code RRC in a combination of the context coding for first bits and bypass coding (with Rice derivation) for remaining bits of the RRC. This "hybrid" procedure is described in greater detail below.

FIG. 1 is a block diagram illustrating an example video encoding and decoding system 100 that may perform the techniques of this disclosure. The techniques of this disclosure are generally directed to coding (encoding and/or decoding) video data. In general, video data includes any data for processing a video. Thus, video data may include raw, unencoded video, encoded video, decoded (e.g., reconstructed) video, and video metadata, such as signaling data.

As shown in FIG. 1, system 100 includes a source device 102 that provides encoded video data to be decoded and displayed by a destination device 116, in this example. In particular, source device 102 provides the video data to destination device 116 via a computer-readable medium 110. Source device 102 and destination device 116 may comprise any of a wide range of devices, including desktop computers, notebook (i.e., laptop) computers, mobile devices, tablet computers, set-top boxes, telephone handsets such as smartphones, televisions, cameras, display devices, digital media players, video gaming consoles, video streaming device, broadcast receiver devices, or the like. In some cases, source device 102 and destination device 116 may be equipped for wireless communication, and thus may be referred to as wireless communication devices.

In the example of FIG. 1, source device 102 includes video source 104, memory 106, video encoder 200, and output interface 108. Destination device 116 includes input interface 122, video decoder 300, memory 120, and display device 118. In accordance with this disclosure, video encoder 200 of source device 102 and video decoder 300 of destination device 116 may be configured to apply the techniques for Rice parameter derivation for regular residual coding (RRC) in high bit-depth coding. Thus, source device 102 represents an example of a video encoding device, while destination device 116 represents an example of a video decoding device. In other examples, a source device and a destination device may include other components or arrangements. For example, source device 102 may receive video data from an external video source, such as an external camera. Likewise, destination device 116 may interface with an external display device, rather than include an integrated display device.

System 100 as shown in FIG. 1 is merely one example. In general, any digital video encoding and/or decoding device may perform techniques for Rice parameter derivation for RRC in high bit-depth coding. Source device 102 and destination device 116 are merely examples of such coding devices in which source device 102 generates coded video data for transmission to destination device 116. This disclosure refers to a "coding" device as a device that performs coding (encoding and/or decoding) of data. Thus, video encoder 200 and video decoder 300 represent examples of coding devices, in particular, a video encoder and a video decoder, respectively. In some examples, source device 102 and destination device 116 may operate in a substantially symmetrical manner such that each of source device 102 and destination device 116 includes video encoding and decoding components. Hence, system 100 may support one-way or two-way video transmission between source device 102 and destination device 116, e.g., for video streaming, video playback, video broadcasting, or video telephony.

In general, video source 104 represents a source of video data (i.e., raw, unencoded video data) and provides a sequential series of pictures (also referred to as "frames") of the video data to video encoder 200, which encodes data for the pictures. Video source 104 of source device 102 may include a video capture device, such as a video camera, a video archive containing previously captured raw video, and/or a video feed interface to receive video from a video content provider. As a further alternative, video source 104 may generate computer graphics-based data as the source video, or a combination of live video, archived video, and computer-generated video. In each case, video encoder 200 encodes the captured, pre-captured, or computer-generated video data. Video encoder 200 may rearrange the pictures from the received order (sometimes referred to as "display order") into a coding order for coding. Video encoder 200 may generate a bitstream including encoded video data. Source device 102 may then output the encoded video data via output interface 108 onto computer-readable medium 110 for reception and/or retrieval by, e.g., input interface 122 of destination device 116.

Memory 106 of source device 102 and memory 120 of destination device 116 represent general purpose memories. In some examples, memories 106, 120 may store raw video data, e.g., raw video from video source 104 and raw, decoded video data from video decoder 300. Additionally or alternatively, memories 106, 120 may store software instructions executable by, e.g., video encoder 200 and video decoder 300, respectively. Although memory 106 and memory 120 are shown separately from video encoder 200 and video decoder 300 in this example, it should be understood that video encoder 200 and video decoder 300 may also include internal memories for functionally similar or equivalent purposes. Furthermore, memories 106, 120 may store encoded video data, e.g., output from video encoder 200 and input to video decoder 300. In some examples, portions of memories 106, 120 may be allocated as one or more video buffers, e.g., to store raw, decoded, and/or encoded video data.

Computer-readable medium 110 may represent any type of medium or device capable of transporting the encoded video data from source device 102 to destination device 116. In one example, computer-readable medium 110 represents a communication medium to enable source device 102 to transmit encoded video data directly to destination device 116 in real-time, e.g., via a radio frequency network or computer-based network. Output interface 108 may modulate a transmission signal including the encoded video data, and input interface 122 may demodulate the received transmission signal, according to a communication standard, such as a wireless communication protocol. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 102 to destination device 116.

In some examples, source device 102 may output encoded data from output interface 108 to storage device 112. Similarly, destination device 116 may access encoded data from storage device 112 via input interface 122. Storage device 112 may include any of a variety of distributed or locally accessed data storage media such as a hard drive, Blu-ray discs, DVDs, CD-ROMs, flash memory, volatile or non-volatile memory, or any other suitable digital storage media for storing encoded video data.

In some examples, source device 102 may output encoded video data to file server 114 or another intermediate storage device that may store the encoded video data generated by source device 102. Destination device 116 may access stored video data from file server 114 via streaming or download.

File server 114 may be any type of server device capable of storing encoded video data and transmitting that encoded video data to the destination device 116. File server 114 may represent a web server (e.g., for a website), a server configured to provide a file transfer protocol service (such as File Transfer Protocol (FTP) or File Delivery over Unidirectional Transport (FLUTE) protocol), a content delivery network (CDN) device, a hypertext transfer protocol (HTTP) server, a Multimedia Broadcast Multicast Service (MBMS) or Enhanced MBMS (eMBMS) server, and/or a network attached storage (NAS) device. File server 114 may, additionally or alternatively, implement one or more HTTP streaming protocols, such as Dynamic Adaptive Streaming over HTTP (DASH), HTTP Live Streaming (HLS), Real Time Streaming Protocol (RTSP), HTTP Dynamic Streaming, or the like.

Destination device 116 may access encoded video data from file server 114 through any standard data connection, including an Internet connection. This may include a wireless channel (e.g., a Wi-Fi connection), a wired connection (e.g., digital subscriber line (DSL), cable modem, etc.), or a combination of both that is suitable for accessing encoded video data stored on file server 114. Input interface 122 may be configured to operate according to any one or more of the various protocols discussed above for retrieving or receiving media data from file server 114, or other such protocols for retrieving media data.

Output interface 108 and input interface 122 may represent wireless transmitters/receivers, modems, wired networking components (e.g., Ethernet cards), wireless communication components that operate according to any of a variety of IEEE 802.11 standards, or other physical components. In examples where output interface 108 and input interface 122 comprise wireless components, output interface 108 and input interface 122 may be configured to transfer data, such as encoded video data, according to a cellular communication standard, such as 4G, 4G-LTE (Long-Term Evolution), LTE Advanced, 5G, or the like. In some examples where output interface 108 comprises a wireless transmitter, output interface 108 and input interface 122 may be configured to transfer data, such as encoded video data, according to other wireless standards, such as an IEEE 802.11 specification, an IEEE 802.15 specification (e.g., ZigBee™), a Bluetooth™ standard, or the like. In some examples, source device 102 and/or destination device 116 may include respective system-on-a-chip (SoC) devices. For example, source device 102 may include an SoC device to perform the functionality attributed to video encoder 200 and/or output interface 108, and destination device 116 may include an SoC device to perform the functionality attributed to video decoder 300 and/or input interface 122.

The techniques of this disclosure may be applied to video coding in support of any of a variety of multimedia applications, such as over-the-air television broadcasts, cable television transmissions, satellite television transmissions, Internet streaming video transmissions, such as dynamic adaptive streaming over HTTP (DASH), digital video that is encoded onto a data storage medium, decoding of digital video stored on a data storage medium, or other applications.

Input interface 122 of destination device 116 receives an encoded video bitstream from computer-readable medium 110 (e.g., a communication medium, storage device 112, file server 114, or the like). The encoded video bitstream may include signaling information defined by video encoder 200, which is also used by video decoder 300, such as syntax elements having values that describe characteristics and/or processing of video blocks or other coded units (e.g., slices, pictures, groups of pictures, sequences, or the like). Display device 118 displays decoded pictures of the decoded video data to a user. Display device 118 may represent any of a variety of display devices such as a liquid crystal display (LCD), a plasma display, an organic light emitting diode (OLED) display, or another type of display device.

Although not shown in FIG. 1, in some examples, video encoder 200 and video decoder 300 may each be integrated with an audio encoder and/or audio decoder, and may include appropriate MUX-DEMUX units, or other hardware and/or software, to handle multiplexed streams including both audio and video in a common data stream. If applicable, MUX-DEMUX units may conform to the ITU H.223 multiplexer protocol, or other protocols such as the user datagram protocol (UDP).

Video encoder 200 and video decoder 300 each may be implemented as any of a variety of suitable encoder and/or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 200 and video decoder 300 may be included in one or more encoders or decoders, either of which may be integrated as part of a combined encoder/decoder (CODEC) in a respective device. A device including video encoder 200 and/or video decoder 300 may comprise an integrated circuit, a microprocessor, and/or a wireless communication device, such as a cellular telephone.

Video encoder 200 and video decoder 300 may operate according to a video coding standard, such as ITU-T H.265, also referred to as High Efficiency Video Coding (HEVC) or extensions thereto, such as the multi-view and/or scalable video coding extensions. Alternatively, video encoder 200 and video decoder 300 may operate according to other proprietary or industry standards, such as ITU-T H.266, also referred to as Versatile Video Coding (VVC). An objective of VVC is to provide a significant improvement in compression performance over the existing HEVC standard, aiding in deployment of higher-quality video services and emerging applications such as 360° omnidirectional immersive multimedia and high-dynamic-range (HDR) video. A draft of the VVC standard is described in Bross, et al. "Versatile Video Coding (Draft 10)," Joint Video Experts Team (JVET) of ITU-T SG 16 WP 3 and ISO/IEC JTC 1/SC 29/WG 11, 18$^{th}$ Meeting: by teleconference, 22 Jun.-1 Jul. 2020, JVET-S2001-vH (hereinafter "VVC Draft 10"). The techniques of this disclosure, however, are not limited to any particular coding standard.

In general, video encoder 200 and video decoder 300 may perform block-based coding of pictures. The term "block" generally refers to a structure including data to be processed (e.g., encoded, decoded, or otherwise used in the encoding and/or decoding process). For example, a block may include a two-dimensional matrix of samples of luminance and/or chrominance data. In general, video encoder 200 and video decoder 300 may code video data represented in a YUV (e.g., Y, Cb, Cr) format. That is, rather than coding red, green, and blue (RGB) data for samples of a picture, video encoder 200 and video decoder 300 may code luminance and chrominance components, where the chrominance components may include both red hue and blue hue chrominance components. In some examples, video encoder 200 converts received RGB formatted data to a YUV representation prior to encoding, and video decoder 300 converts the YUV representation to the RGB format. Alternatively, pre- and post-processing units (not shown) may perform these conversions.

This disclosure may generally refer to coding (e.g., encoding and decoding) of pictures to include the process of encoding or decoding data of the picture. Similarly, this disclosure may refer to coding of blocks of a picture to include the process of encoding or decoding data for the blocks, e.g., prediction and/or residual coding. An encoded video bitstream generally includes a series of values for syntax elements representative of coding decisions (e.g., coding modes) and partitioning of pictures into blocks. Thus, references to coding a picture or a block should generally be understood as coding values for syntax elements forming the picture or block.

HEVC defines various blocks, including coding units (CUs), prediction units (PUs), and transform units (TUs). According to HEVC, a video coder (such as video encoder 200) partitions a coding tree unit (CTU) into CUs according to a quadtree structure. That is, the video coder partitions CTUs and CUs into four equal, non-overlapping squares, and each node of the quadtree has either zero or four child nodes. Nodes without child nodes may be referred to as "leaf nodes," and CUs of such leaf nodes may include one or more PUs and/or one or more TUs. The video coder may further partition PUs and TUs. For example, in HEVC, a residual quadtree (RQT) represents partitioning of TUs. In HEVC, PUs represent inter-prediction data, while TUs represent residual data. CUs that are intra-predicted include intra-prediction information, such as an intra-mode indication.

As another example, video encoder 200 and video decoder 300 may be configured to operate according to VVC. According to VVC, a video coder (such as video encoder 200) partitions a picture into a plurality of coding tree units (CTUs). Video encoder 200 may partition a CTU according to a tree structure, such as a quadtree-binary tree (QTBT) structure or Multi-Type Tree (MTT) structure. The QTBT structure removes the concepts of multiple partition types, such as the separation between CUs, PUs, and TUs of HEVC. A QTBT structure includes two levels: a first level partitioned according to quadtree partitioning, and a second level partitioned according to binary tree partitioning. A root node of the QTBT structure corresponds to a CTU. Leaf nodes of the binary trees correspond to coding units (CUs).

In an MTT partitioning structure, blocks may be partitioned using a quadtree (QT) partition, a binary tree (BT) partition, and one or more types of triple tree (TT) (also called ternary tree (TT)) partitions. A triple or ternary tree partition is a partition where a block is split into three sub-blocks. In some examples, a triple or ternary tree partition divides a block into three sub-blocks without dividing the original block through the center. The partitioning types in MTT (e.g., QT, BT, and TT), may be symmetrical or asymmetrical.

In some examples, video encoder 200 and video decoder 300 may use a single QTBT or MTT structure to represent each of the luminance and chrominance components, while in other examples, video encoder 200 and video decoder 300 may use two or more QTBT or MTT structures, such as one QTBT/MTT structure for the luminance component and another QTBT/MTT structure for both chrominance components (or two QTBT/MTT structures for respective chrominance components).

Video encoder 200 and video decoder 300 may be configured to use quadtree partitioning per HEVC, QTBT partitioning, MTT partitioning, or other partitioning structures. For purposes of explanation, the description of the techniques of this disclosure is presented with respect to QTBT partitioning. However, it should be understood that the techniques of this disclosure may also be applied to video coders configured to use quadtree partitioning, or other types of partitioning as well.

In some examples, a CTU includes a coding tree block (CTB) of luma samples, two corresponding CTBs of chroma samples of a picture that has three sample arrays, or a CTB of samples of a monochrome picture or a picture that is coded using three separate color planes and syntax structures used to code the samples. A CTB may be an N×N block of samples for some value of N such that the division of a component into CTBs is a partitioning. A component is an array or single sample from one of the three arrays (luma and two chroma) that compose a picture in 4:2:0, 4:2:2, or 4:4:4 color format or the array or a single sample of the array that compose a picture in monochrome format. In some examples, a coding block is an M×N block of samples for some values of M and N such that a division of a CTB into coding blocks is a partitioning.

The blocks (e.g., CTUs or CUs) may be grouped in various ways in a picture. As one example, a brick may refer to a rectangular region of CTU rows within a particular tile in a picture. A tile may be a rectangular region of CTUs within a particular tile column and a particular tile row in a picture. A tile column refers to a rectangular region of CTUs having a height equal to the height of the picture and a width specified by syntax elements (e.g., such as in a picture parameter set). A tile row refers to a rectangular region of CTUs having a height specified by syntax elements (e.g., such as in a picture parameter set) and a width equal to the width of the picture.

In some examples, a tile may be partitioned into multiple bricks, each of which may include one or more CTU rows within the tile. A tile that is not partitioned into multiple bricks may also be referred to as a brick. However, a brick that is a true subset of a tile may not be referred to as a tile.

The bricks in a picture may also be arranged in a slice. A slice may be an integer number of bricks of a picture that may be exclusively contained in a single network abstraction layer (NAL) unit. In some examples, a slice includes either a number of complete tiles or only a consecutive sequence of complete bricks of one tile.

This disclosure may use "N×N" and "N by N" interchangeably to refer to the sample dimensions of a block (such as a CU or other video block) in terms of vertical and horizontal dimensions, e.g., 16×16 samples or 16 by 16 samples. In general, a 16×16 CU will have 16 samples in a vertical direction (y=16) and 16 samples in a horizontal direction (x=16). Likewise, an N×N CU generally has N samples in a vertical direction and N samples in a horizontal direction, where N represents a nonnegative integer value.

The samples in a CU may be arranged in rows and columns. Moreover, CUs need not necessarily have the same number of samples in the horizontal direction as in the vertical direction. For example, CUs may comprise N×M samples, where M is not necessarily equal to N.

Video encoder 200 encodes video data for CUs representing prediction and/or residual information, and other information. The prediction information indicates how the CU is to be predicted in order to form a prediction block for the CU. The residual information generally represents sample-by-sample differences between samples of the CU prior to encoding and the prediction block.

To predict a CU, video encoder 200 may generally form a prediction block for the CU through inter-prediction or intra-prediction. Inter-prediction generally refers to predicting the CU from data of a previously coded picture, whereas intra-prediction generally refers to predicting the CU from previously coded data of the same picture. To perform inter-prediction, video encoder 200 may generate the prediction block using one or more motion vectors. Video encoder 200 may generally perform a motion search to identify a reference block that closely matches the CU, e.g., in terms of differences between the CU and the reference block. Video encoder 200 may calculate a difference metric using a sum of absolute difference (SAD), sum of squared differences (SSD), mean absolute difference (MAD), mean squared differences (MSD), or other such difference calculations to determine whether a reference block closely matches the current CU. In some examples, video encoder 200 may predict the current CU using uni-directional prediction or bi-directional prediction.

Some examples of VVC also provide an affine motion compensation mode, which may be considered an inter-prediction mode. In affine motion compensation mode, video encoder 200 may determine two or more motion vectors that represent non-translational motion, such as zoom in or out, rotation, perspective motion, or other irregular motion types.

To perform intra-prediction, video encoder 200 may select an intra-prediction mode to generate the prediction block. Some examples of VVC provide sixty-seven intra-prediction modes, including various directional modes, as well as planar mode and DC mode. In general, video encoder 200 selects an intra-prediction mode that describes neighboring samples to a current block (e.g., a block of a CU) from which to predict samples of the current block. Such samples may generally be above, above and to the left, or to the left of the current block in the same picture as the current block, assuming video encoder 200 codes CTUs and CUs in raster scan order (left to right, top to bottom).

Video encoder 200 encodes data representing the prediction mode for a current block. For example, for inter-prediction modes, video encoder 200 may encode data representing which of the various available inter-prediction modes is used, as well as motion information for the corresponding mode. For uni-directional or bi-directional inter-prediction, for example, video encoder 200 may encode motion vectors using advanced motion vector prediction (AMVP) or merge mode. Video encoder 200 may use similar modes to encode motion vectors for affine motion compensation mode.

Following prediction, such as intra-prediction or inter-prediction of a block, video encoder 200 may calculate residual data for the block. The residual data, such as a residual block, represents sample-by-sample differences between the block and a prediction block for the block, formed using the corresponding prediction mode. Video encoder 200 may apply one or more transforms to transform blocks (TBs) within the residual block, to produce transformed data in a transform domain instead of the sample domain. In some examples, a TB may be the same size as the residual block. The terms TB and TU may be used in this document interchangeably. Video encoder 200 may apply a discrete cosine transform (DCT), an integer transform, a wavelet transform, or a conceptually similar transform to residual video data. Additionally, video encoder 200 may apply a secondary transform following the first transform, such as a mode-dependent non-separable secondary transform (MDNSST), a signal dependent transform, a Karhunen-Loeve transform (KLT), or the like. Video encoder 200 produces transform coefficients following application of the one or more transforms.

As noted above, following any transforms to produce transform coefficients, video encoder 200 may perform quantization of the transform coefficients. Quantization generally refers to a process in which transform coefficients are quantized to possibly reduce the amount of data used to represent the transform coefficients, providing further compression. By performing the quantization process, video encoder 200 may reduce the bit depth associated with some or all of the transform coefficients. For example, video encoder 200 may round an n-bit value down to an m-bit value during quantization, where n is greater than m. In some examples, to perform quantization, video encoder 200 may perform a bitwise right-shift of the value to be quantized.

Following quantization, video encoder 200 may scan the transform coefficients, producing a one-dimensional vector from the two-dimensional matrix including the quantized transform coefficients. The scan may be designed to place higher energy (and therefore lower frequency) transform coefficients at the front of the vector and to place lower energy (and therefore higher frequency) transform coefficients at the back of the vector. In some examples, video encoder 200 may utilize a predefined scan order to scan the quantized transform coefficients to produce a serialized vector, and then entropy encode the quantized transform coefficients of the vector. In other examples, video encoder 200 may perform an adaptive scan. After scanning the quantized transform coefficients to form the one-dimensional vector, video encoder 200 may entropy encode the one-dimensional vector, e.g., according to context-adaptive binary arithmetic coding (CABAC). Video encoder 200 may also entropy encode values for syntax elements describing metadata associated with the encoded video data for use by video decoder 300 in decoding the video data.

To perform CABAC, video encoder 200 may assign a context within a context model to a symbol to be transmitted. The context may relate to, for example, whether neighboring values of the symbol are zero-valued or not. The probability determination may be based on a context assigned to the symbol.

Video encoder 200 may further generate syntax data, such as block-based syntax data, picture-based syntax data, and sequence-based syntax data, to video decoder 300, e.g., in a picture header, a block header, a slice header, or other syntax data, such as a sequence parameter set (SPS), picture parameter set (PPS), or video parameter set (VPS). Video decoder 300 may likewise decode such syntax data to determine how to decode corresponding video data.

In this manner, video encoder 200 may generate a bitstream including encoded video data, e.g., syntax elements describing partitioning of a picture into blocks (e.g., CUs) and prediction and/or residual information for the blocks. Ultimately, video decoder 300 may receive the bitstream and decode the encoded video data.

In general, video decoder 300 performs a reciprocal process to that performed by video encoder 200 to decode the encoded video data of the bitstream. For example, video decoder 300 may decode values for syntax elements of the bitstream using CABAC in a manner substantially similar to, albeit reciprocal to, the CABAC encoding process of video encoder 200. The syntax elements may define partitioning information for partitioning of a picture into CTUs, and partitioning of each CTU according to a corresponding partition structure, such as a QTBT structure, to define CUs of the CTU. The syntax elements may further define prediction and residual information for blocks (e.g., CUs) of video data.

The residual information may be represented by, for example, quantized transform coefficients. Video decoder 300 may inverse quantize and inverse transform the quantized transform coefficients of a block to reproduce a residual block for the block. Video decoder 300 uses a signaled prediction mode (intra- or inter-prediction) and related prediction information (e.g., motion information for inter-prediction) to form a prediction block for the block. Video decoder 300 may then combine the prediction block and the residual block (on a sample-by-sample basis) to reproduce the original block. Video decoder 300 may perform additional processing, such as performing a deblocking process to reduce visual artifacts along boundaries of the block.

Video encoder 200 may generate Rice codes for transform coefficients. The Rice codes may be encoded versions of syntax elements, such as remainder syntax elements and absolute value syntax elements of the transform coefficients. Video encoder 200 may entropy encode (e.g., CABAC encode) the Rice codes for the transform coefficients and include the resulting CABAC-encoded data in a bitstream. Video decoder 300 may apply entropy decoding (e.g., CABAC decoding) to bit sequences in the bitstream to obtain the Rice codes. Video decoder 300 may decode the Rice codes to obtain decoded values that video decoder 300 may use the recover the levels of the transform coefficients. Video encoder 200 and video decoder 300 may determine Rice parameters to use in generating and decoding the Rice codes.

Figure 2:
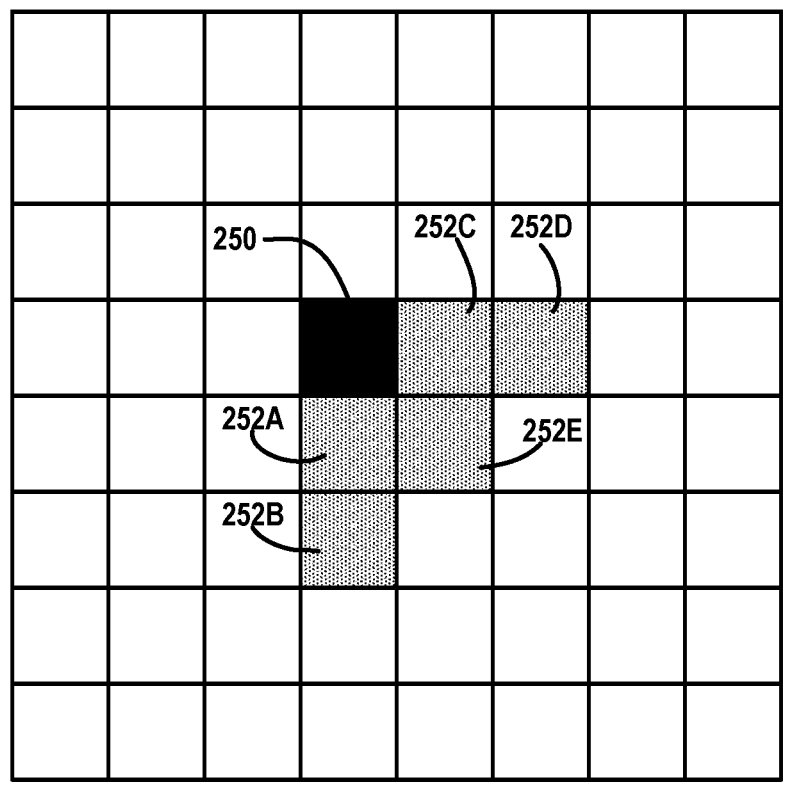
FIG. 2 is a conceptual diagram illustrating an example of neighboring coefficients that may be used in calculation of a local sum value of a current coefficient, in accordance with one or more techniques of this disclosure.
Figure 2:
Figure 2:
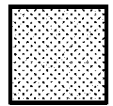

In VVC Draft 10, Rice parameters for regular residual coding (RRC) are derived using a look-up table with consideration of transform coefficient values (i.e., levels) of neighboring transform coefficients in a template. The template of the neighboring coefficients is presented in FIG. 2. FIG. 2 is a conceptual diagram illustrating an example of neighboring coefficients that may be used in calculation of a local sum value (e.g., localSumAbs) of a current coefficient. Specifically, in the example of FIG. 2, video encoder 200 or video decoder 300 is determining a Rice parameter for a current transform coefficient 250. Video encoder 200 and video decoder 300 may use the levels of neighboring transform coefficients 252A-252E (collectively, "neighboring transform coefficients 252") in the calculation of the local sum value.

In VVC Draft 10, a video coder (e.g., video encoder 200 or video decoder 300) may first calculate the local sum value (e.g., locSumAbs), which is the sum of absolute values of five available neighboring transform coefficients (e.g., neighboring transform coefficients 252) in the template. The video coder may then normalize the locSumAbs (e.g., using subtraction and clipping operations) as follows:

$$locSumAbs = Clip3(0, 31, locSumAbs - baseLevel*5)$$

The video coder may derive the Rice parameter using this locSumAbs with a look-up table, such as Table 1, below. As shown in Table 1, the Rice parameter range is constrained from 0 to 3 in the design of VVC Draft 10.

TABLE 1

Look-up table for Rice Parameter based on locSumAbs in current spec

| locSumAbs | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| cRiceParam | 0 | 0 | 0 | 0 | 0 | 0 | 0 | 1 | 1 | 1 | 1 | 1 | 1 | 1 | 2 | 2 |
| locSumAbs | 16 | 17 | 18 | 19 | 20 | 21 | 22 | 23 | 24 | 25 | 26 | 27 | 28 | 29 | 30 | 31 |
| cRiceParam | 2 | 12 | 2 | 2 | 12 | 2 | 12 | 2 | 2 | £2 | 2 | 2 | 3 | 3 | 3 | 3 |

Earlier proposals have attempted to address limitations of the VVC's Rice parameter derivation with respect to various input bit-depths of video data, and may thus improve compression efficiency of the coding design. In other words, the Rice parameter derivation process described in VVC Draft 10 may have limitations when applied to higher bitdepth video data. These limitations may lead to losses in compression efficiency.

For example, a video coder may scale or normalize localSumAbs to handle a bitdepth increase or dynamical range of transform coefficients before being used to derive a Rice parameter, see e.g., Eq. 1517 of VVC Draft 10. The amount of scaling factor may depend on the input bitdepth, a predefined operational bit depth, (e.g., 10), local activity of transform coefficients, a block size, or a syntax element signaled in the bitstream. The video coder may then clip localSumAbs to a certain range, e.g., using the clipping process of localSumAbs in VVC Draft 10. The video coder may use the normalized and clipped localSumAbs to derive the Rice parameter using a predefined lookup table, such as the current look up table in VVC Draft 10 (i.e., Table 1, which is presented above). With localSumAbs being normalized in the first step of the proposed design, the video coder may derive the Rice parameter from the predefined table and may modify the Rice parameter by adding an offset to extend the dynamical range of the Rice parameter.

The following text describes a process for determining a Rice parameter for a remainder syntax element (abs_remainder) or an absolute value syntax element (dec_abs_level) of a transform coefficient.

9.3.3.2 Rice Parameter Derivation Process for Abs_Remainder[ ] and Dec_Abs_Level[ ]

Inputs to this process are the base level baseLevel, the color component index cIdx, the luma location (x0, y0) specifying the top-left sample of the current transform block relative to the top-left sample of the current picture, the current coefficient scan location (xC, yC), the binary logarithm of the transform block width log 2TbWidth, and the binary logarithm of the transform block height log 2TbHeight.

Output of this process is the Rice parameter cRiceParam.

Given the array AbsLevel[x][y] for the transform block with component index cIdx and the top-left luma location (x0, y0), the variable locSumAbs is derived as specified by the following pseudo-code process:

Coding Listing 1

```
locSumAbs = 0
if( xC < ( 1 << log2TbWidth ) - 1 ) {
        locSumAbs += AbsLevel[ xC + 1 ][ yC ]
        if( xC < ( 1 << log2TbWidth ) - 2 )
          locSumAbs += AbsLevel[ xC + 2 ][ yC ]
        if( yC < ( 1 << log2TbHeight ) - 1 )
          locSumAbs += AbsLevel[ xC + 1 ][ yC + 1 ]      (1517)
}
if( yC < ( 1 << log2TbHeight ) - 1 ) {
        locSumAbs += AbsLevel[ xC ][ yC + 1 ]
        if( yC < ( 1 << log2TbHeight ) - 2 )
          locSumAbs += AbsLevel[ xC ][ yC + 2 ]
}
shift = (Bitdepth - b) > 0 ? Floor(Log2(a*(Bitdepth - b))) : 0
localSumAbs = (shift == 0) ? localSumAbs : (localSumAbs + (1 << (shift -1) )) >> shift
locSumAbs = Clip3( 0, 31, locSumAbs - baseLevel * 5 )
Given the variable locSumAbs, the Rice parameter cRiceParam is derived as specified
in Table 128.
cRiceParam is then refined as:
        cRiceParam = cRiceParam + c
```

In some examples, variables a, b and c can be defined as follows. In one example, b may specify operation bitdepth and set equal to 10, a may be set equal to integer value, e.g., 4, or other value of power of 2, and c may be set equal to the computed shift value, or derived from the shift value.

In another example for addressing VVC's Rice parameter derivation with respect to various input bit-depths of video data, a video coder may scale/normalize localSumAbs when localSumAbs is larger than or equal to a threshold. In this case, the related Rice parameter derivation part in VVC Draft 10 may be accordingly changed as follows (with <!> . . . </!> tags indicating changes):

9.3.3.2 Rice Parameter Derivation Process for Abs_Remainder[ ] and Dec_Abs_Level[ ]

Inputs to this process are the base level baseLevel, the color component index cIdx, the luma location (x0, y0) specifying the top-left sample of the current transform block relative to the top-left sample of the current picture, the current coefficient scan location (xC, yC), the binary logarithm of the transform block width log 2TbWidth, and the binary logarithm of the transform block height log 2TbHeight.

Output of this process is the Rice parameter cRiceParam.

Given the array AbsLevel[x] [y] for the transform block with component index cIdx and the top-left luma location (x0, y0), the variable locSumAbs is derived as specified by the following pseudo-code process:

---
Code Listing 2
---

```
locSumAbs = 0
if( xC < ( 1 << log2TbWidth ) - 1 ) {
  locSumAbs += AbsLevel[ xC + 1 ][ yC ]
  if( xC < ( 1 << log2TbWidth ) - 2 )
    locSumAbs += AbsLevel[ xC + 2 ][ yC ]
  if( yC < ( 1 << log2TbHeight ) - 1 )
    locSumAbs += AbsLevel[ xC + 1 ][ yC + 1 ]             (1517)
}
      if( yC < ( 1 << log2TbHeight ) - 1 ) {
        locSumAbs += AbsLevel[ xC ][ yC + 1 ]
        if( yC < ( 1 << log2TbHeight ) - 2 )
          locSumAbs += AbsLevel[ xC ][ yC + 2 ]
      }
      <!>shift = (Bitdepth - b) > 0) && (localSumAbs - baseLevel * 5) >= T ?
      Floor(Log2(a*(Bitdepth - b))) : 0
      localSumAbs = (shift == 0) ? localSumAbs : (localSumAbs + (1 << (shift -1) ))
      >> shift</!>
      locSumAbs = Clip3( 0, 31, locSumAbs - baseLevel * 5 )
Given the variable locSumAbs, the Rice parameter cRiceParam is derived as specified
in Table 128.
cRiceParam is then refined as:
      <!>cRiceParam = cRiceParam + c</!>
```

In the above example, T is a predefined threshold. In one example, T may be set equal to 32. In some examples, values of variables a, b and c are signaled through bitstreams (i.e., encoded in bitstreams) or set dependent or derived from a bitdepth, local statistics (e.g., min/max or mean of the transform coefficients values within current block), decoded transform or block size, or syntax element signaled in the bitstream.

Figure 3:
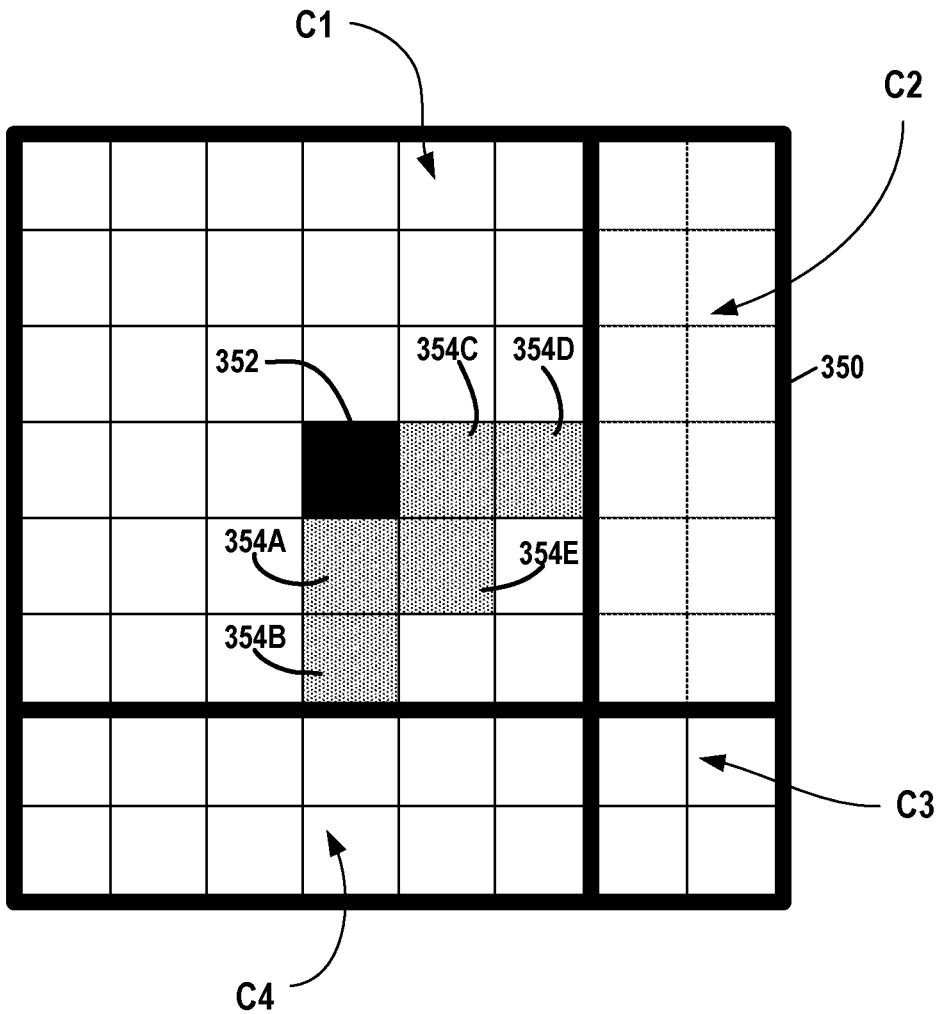
FIG. 3 is a conceptual diagram illustrating example spatial regions, in accordance with one or more techniques of this disclosure.
Figure 3:
Figure 3:
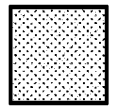

Furthermore, spatial positions of decoded transform coefficients within a TU (or TB) may be classified as per anticipated accuracy of the template-based derivation procedure. An example classification is shown in FIG. 3. FIG. 3 is a conceptual diagram illustrating example spatial regions of a TB 350. In the example of FIG. 3, TB 350 includes a current transform coefficient 352 and neighboring transform coefficients 354A-354E (collectively, "neighboring transform coefficients 354"). Furthermore, in the example of FIG. 3, transform coefficients with spatial positions outlined by the thick lines (class C1) are expected to have accurate Rice derivation from the template-based procedure, e.g., as defined in VVC clause 9.3.3.2, and possible modification of the template-based procedure described above in this document. In other words, the Rice parameter (riceParam) for a transform coefficient in class C1 may be described as:

riceParam=template_based_method( ).

Transform coefficients with spatial positions outlined by the thick lines for class (C4) are expected to have no accurate Rice derivation from the template-based procedure. Thus, a history-based derivation procedure may be used instead. In other words, the Rice parameter (riceParam) for a transform coefficient in class C4 may be described as:

riceParam=history_based_method( ).

The coefficients with spatial positions outlined by the thick lines for class C2 or class C3 are expected to have reduced accuracy Rice derivation from the template-based procedure, and the accuracy can be improved by taking into consideration Rice estimates provided they derive from history of the decoded coefficients. Thus, the Rice parameter for a transform coefficient in class C2 or class C3 may be based on the Rice parameter as derived by the template-based procedure and/or the history-based procedure. In other words, the Rice parameter (riceParam) for a transform coefficient in class C2 or class C3 may be described as:

riceParam=function(template_based_method( ),history_based_method( )).

In some examples, classification of transform coefficients can be based on the run of the scan order in the inverse direction, e.g., assigning N first decoded transform coefficients to class C4 and the rest of the transform coefficients being classified as class C1. In some examples, a subset of the defined classes can be used, e.g., only class C4 decoded transform coefficients use Rice information from the history, and support of class C1 can be extended to incorporate the areas of classes C2/C3 or the entire TU or TB. Thus, no history information is used for Rice derivation.

In some previous proposals, the Rice parameter of a transform coefficient is determined as a function of aggregating Rice information from a template-based procedure and a history-based procedure using a weighted average. An example is shown below:

ricePar=(w2*riceParTemplate+w1*riceParHistory)/(w1+w2);

The weights (w1 and w2) of the weighted average may be dependent on spatial locations of transform coefficients within a TB.

In some examples, a function of aggregating local estimates and historic information can be integrated in the template-based derivation, such that Rice parameters derived from the historic information can be taken into consideration during the template-based Rice derivation if local information is not available. An example is shown below with proposed changes to the existing template-based procedure marked with <!> . . . </!> tags. The term histCoef defines an estimated historic transform coefficient, e.g., accumulated in past, or expressed as a historic Rice parameter, e.g., histCoef=1<<histRiceParam. The terms M and N are estimated weight values, e.g., integer values may be equal to 2 and 3 for N and M, respectively.

Code Listing 3

```
unsigned templateAbsSum( int scanPos, const TCoeff* coeff, int baseLevel )
{
  const uint32_t posY = m_scan[scanPos].y;
  const uint32_t posX = m_scan[scanPos].x;
  const TCoeff* pData = coeff + posX + posY * m_width;
  TCoeff     sum = 0;
  if (posX < m_width - 1)
  {
    sum += abs(pData[1]);
    if (posX < m_width - 2)
    {
      sum += abs(pData[2]);
    }
    <!>else sum += histCoef;</!>
    if (posY < m_height - 1)
    {
      sum += abs(pData[m_width + 1]);
    }
    <!>else sum += histCoef;</!>
  }
    <!>else sum += N * histCoef;</!>
  if (posY < m_height - 1)
  {
    sum += abs(pData[m_width]);
    if (posY < m_height - 2)
    {
      sum += abs(pData[m_width << 1]);
    }
    <!>else sum += histCoef;</!>
  }
    <!>else sum += M * histCoef;</!>
  return unsigned(std::max<TCoeff>(std::min<TCoeff>(sum - 5 * baseLevel, 31), 0));
}
```

In some examples, a history-based procedure for Rice derivation can be implemented using a counter. The counter may be a moving average value stored as a decoded transform coefficient, a Rice parameter, or as a length of a binary codeword that expresses a decoded transform coefficient. One example is shown below:

For each class (e.g., class C1, C2, C3, C4), where the class is identified by index riceClass, a separate history is calculated and stored in counter StatCoeff[riceClass]. During TB decoding, each decoded transform coefficient defined for history update can be expressed through a binary codelength estimate, which is indicative of an optimal Rice parameter. In some examples, a video coder may update the history by a codelength representation (number of bits) of the Exp-Golomb coded part of the first transform coefficient. This may reduce latency for full transform coefficient reconstruction. In some examples, the video coder may use all transform coefficients to update the history.

The number of transform coefficients defined for history update is denoted NUM_HISTORY_UPDATE.

codeLength=floorLog2((uint32_t)decodedCoef);

The number of decoded transform coefficients (e.g., NUM_HISTORY_UPDATE) can be used to update the historic observation, with a sum of codelength (e.g., collectStatCoeff[riceClass]) and a number of coefficients used in the update (e.g., counterCollectStatCoeff) being stored:

collectStatCoeff[riceClass] += codeLength.
counterCollectStatCoeff[riceClass]++;

After the video coder parses all samples defined for the history update of the current class, the video coder may update a global history counter StatCoeff using a linear model, e.g., a weighted moving average, as follows:

```
int numCollected = NUM_HISTORY_UPDATE - g_counterCollectStatCoeff[i];
int averageRiceInTU = (int)( g_tempStatCoeff[i] + (numCollected >> 1))/
numCollected);
    StatCoeff[i][compID] = (w3 * StatCoeff[i][compID] + w4 *
averageRiceInTU)/(w3+w4);
```

In some examples, parameters of the linear model can be selected as derivatives of a power of 2 to enable low complexity multiplication or division operations. In some examples, the history counter (e.g., StatCoeff) can be maintained through a certain region of the decoded picture, e.g., a full picture, a slice, a tile, a group of CTUs, or a single CTU with a normative reset at the start of the group of CTUs. This disclosure may refer to the history counter as a coefficient statistic value (e.g., StatCoeff).

In some examples, a history counter can be initialized with a default value. The default value can be tabulated and provided to the video decoder as side information, signaled through a coded bitstream, e.g., at a slice level, through a special update signaling mechanism, or derived at the decoder side from bitdepth, quantization parameters, or other syntax elements.

In some examples, one or more aspects of the history updating process (e.g., speed of update or parameters of the moving average) can be made dependent on the block size, ratio of block dimensions, coding modes (e.g., use of intra- or inter-prediction), slice type, or signaled syntax elements.

This disclosure introduces several techniques that may improve accuracy of Rice parameter derivation. For example, this disclosure proposes to improve accuracy of the Rice parameter derivation by taking into consideration historic values of optimal Rice parameters, determined from earlier decoded transform coefficients, outside of the current TB.

In some examples, a video coder (e.g., video encoder 200 or video decoder 300) may store a coefficient statistic value (e.g., StatCoeff) as a value derived from a Rice parameter (i.e., a Rice parameter derivative). In examples where the video coder stores the coefficient statistic value (i.e., a history counter) as a Rice parameter derivative, the video coder may derive a history value (e.g., histCoef) as follows:

historyRiceValue = StatCoeff[i][compID];
histCoef = 1 << historyRice Value;

The video coder may use the history value (histCoeff) to determine the local sum value (e.g., localSumAbs), e.g., using the process of Coding Listing 3.

In some examples, a video coder (e.g., video encoder 200 or video decoder 300) may store the coefficient statistic value as a value derived from a transform coefficient (i.e., a transform coefficient derivative). In examples where the video coder stores the coefficient statistic value as a transform coefficient derivative, the video coder may derive a history value histCoef as follows:

historyValue = StatCoeff[i][compID];
histCoef = historyValue;

The video coder may use the history value (histCoeff) to determine the local sum value (e.g., localSumAbs or locSumAbs), e.g., using the process of Coding Listing 3.

In some examples, a histCoef derivation process can be altered as function of the spatial location of the coefficient within a TB, e.g., a function of the sub-group identifier histCoef belongs to. Examples of altering can include adding an offset to the histRice value, or applying an offset or scaler to the histCoef value. In some examples, the histCoef value is made dependent on the type of transform coefficient being encoded/decoded. For instance, if part of the transform coefficient was coded as context coding, and only remaining part is coded with a Rice method. In other words, a video coder may perform a "hybrid" procedure for coding regular residual coefficients (RRC).

In some examples, the code part of the transform coefficient with context coding and a remaining part of the transform coefficient with a Rice method, a video coder (e.g., video encoder 200 or video decoder 300) may set a variable, remBinsPass1, to the maximum number of context-coded bins and the video coder may decrease remBinsPass1 by one when a context-coded bin is signaled. While the remBinsPass1 is larger than or equal to four, a first coding pass, which includes the coefficient significance flag (e.g., sig_coeff_flag), absolute level greater than 1 flag (e.g., abs_level_gt1_flag), a level parity syntax element that indicates a parity of the transform coefficient level (e.g., par_level_flag), and an absolute level greater than 3 flag (e.g., abs_level_gt3_flag), is coded by using context-coded bins. If the number of context-coded bins is not greater than a threshold (e.g., Mccb or RemCcbs) in the first pass coding, the rest part of level information, which is indicated to be further coded in the first pass, is coded with an absolute remainder syntax element (e.g., abs_remainder) using Golomb-Rice coding and bypass-coded bins. The threshold may be defined in VVC as ((1<<(log 2TbWidth+log 2TbHeight))*7)>>2, where log 2TbWidth is the log base 2 of the width of the transform block and log 2TbHeight is the log base 2 of the height of the transform block.

When the remBinsPass1 becomes smaller than 4 while coding the first pass, the rest part of transform coefficients, which are indicated to be further coded in the first pass, are coded with an absolute remainder syntax element (e.g., abs_remainder), and transform coefficients which are not coded in the first pass are directly coded in the second pass with an intermediate value syntax element (e.g., dec_abs_level) by using Golomb-Rice code and bypass-coded bins. The intermediate value syntax element (e.g., dec_abs_level) is an intermediate value that is coded with Golomb-Rice code at a scanned position. The video coder resets the value of remBinsPass1 for every TB. The transition of using

```
ZeroPos = ( QState < 2? 1 : 2 ) << RicePara
if (absLevel == 0)
  dec_abs_level = ZeroPos
else
  dec_abs_level = (absLevel <= ZeroPos) ? (absLevel − 1) :
absLevel
```

In some examples, a video coder (e.g., video encoder 200 or video decoder 300) may maintain a history counter through a certain region (e.g., partition) of the decoded picture, e.g., a full picture, slice, tile, group of CTUs, or a single CTU with normative reset at the start of the partition. The video coder may reset the coefficient statistic value to a default history value (e.g., DefaultHistoryRiceValue). Thus, the normative reset of the coefficient statistic value at the start of the partition may be expressed as:

StatCoeff[$i$][compID]=DefaultHistoryRiceValue;

In some examples where the history counter (i.e., coefficient statistic value) is stored as a Rice parameter derivative, a default value for the history reset (e.g., DefaultHistoryRiceValue) can be expressed as a function of a bitdepth of the coded data, or an internal bitdepth. The internal bitdepth may be greater than the bitdepth of the coded data. A non-limiting example of such dependency of the default history value on a bitdepth can be expressed as follows:

$$\text{DefaultHistoryRiceValue} = (\text{bitDepth} - 10) > 0 ?\ \text{floorLog2}(4 * (\text{bitDepth} - 10)) : 0;$$
$$\text{StatCoeff}[i][\text{compID}] = \text{DefaultHistoryRiceValue};$$

context-coded bins for the coefficient significance flag (e.g., sig_coeff_flag), the level greater than 1 flag (e.g., abs_level_gt1_flag), the level parity flag (e.g., par_level_flag), and absolute level greater than 3 flag (e.g., abs_level_gt3_flag) to using bypass-coded bins for the rest of the transform coefficients only happens at most once per TB. For a transform coefficient subblock, if the remBinsPass1 is smaller than 4, the entire transform coefficient subblock is coded by using bypass-coded bins. After all the above-mentioned level coding, the signs (e.g., sign_flag) for all scan positions with sig_coeff_flag equal to 1 is finally bypass coded.

The video coder uses the unified (same) Rice parameter (ricePar) derivation for Pass 2 and Pass 3. The only difference is that a base level (e.g., baseLevel) is set to 4 and 0 for Pass 2 and Pass 3, respectively. The Rice parameter is determined not only based on the sum of the absolute levels of five neighboring transform coefficients in the local template, but also the corresponding base level is also taken into consideration as follow:

RicePara=RiceParTable[max(min(31,sumAbs−5*baseLevel),0)]

When computing the value sumAbs, a value of 0 is used for any of the neighboring coefficients outside the TB.

After the termination of the 1$^{st}$ subblock coding pass, the absolute value of each of the remaining yet-to-be-coded coefficients is coded by the syntax element dec_abs_level, which corresponds to a modified absolute level value with the zero-level value being conditionally mapped to a non-zero value. At the encoder side, the value of syntax element dec_abs_level is derived from the absolute level (absLevel), dependent quantizer state (QState) and the value of Rice parameter (RicePara) as follows:

The operator floorLog2 represents floor(Log 2(x)), Floor(x) indicates a largest integer less than or equal to x, and Log 2(x) indicates a base-2 logarithm of x.

In other examples, default values for the history reset value (i.e., default history values) can be expressed as a function of a quantization parameter (QP), analytically tabulated or determined in some other way, signaled through the bitstream or provided as side information. In some examples, a linear model and/or non-linear operations, such as clipping or clamping, can be utilized. An example in which the default history value is dependent on a QP is shown below:

```
DefaultHistoryRiceValue = (bitDepth − 10) > 0 ? (int)(OFFSET − cs.slice-
>getSliceQp( ) * MULTIPLIER) : 0;
DefaultHistoryRiceValue = DefaultHistoryRiceValue < 0 ? 0 :
DefaultHistoryRiceValue;
StatCoeff[i][compID] = DefaultHistoryRiceValue;
```

In the text above, the coefficient statistic value is stored as a Rice parameter derivative. Accordingly the default history value is denoted by DefaultHistoryRiceValue. This disclosure may use the terms "DefaultHistoryValue" and "DefaultHistoryRiceValue" interchangeably. OFFSET indicates an offset value, MULTIPLIER indicates a multiplier value, and cs.slice→getSliceQpo is a function that returns a QP of a slice.

In some examples, video decoder 300 may determine a default history value for history reset (e.g., DefaultHistoryRiceValue) through a normative process, e.g., as described above, or can be signaled in the bitstream.

In some examples where the coefficient statistic value is stored as a transform coefficient or a derivative of a transform coefficient, default values for the history reset (e.g., DefaultHistoryCoefValue) can be expressed through a derivation process additional to described above; a non-limiting example of such a procedure is shown below:

```
DefaultHistoryCoefValue= 1 << DefaultHistoryRiceValue;
StatCoeff[i][compID] = DefaultHistoryCoefValue;
```

In some examples, a derivation process for a default history value may take into consideration a color component identifier (ID) or color format. For example, a history value for a chroma component can be derived as a function of the history value for the luma component, e.g., through a bit shift, scaling or an offset.

In some examples where a coefficient statistic value (e.g., history or StatCoeff) is stored as a Rice parameter, a video coder (e.g., video encoder 200 or video decoder 300) can derive a value to update the coefficient statistic value (e.g., history or StatCoeff) from Rice parameters which were utilized to decode a certain group of transform coefficients, e.g., last N transform coefficients, or transform coefficients located at the boundary of the block. An example update is shown below:

```
int averageRiceInTU = (int)(g_tempStatCoeff[i]);
StatCoeff[i][compID] = (StatCoeff[i][compID] + averageRiceInTU) >> 1;
```

In some examples, a Rice estimate value for usage for a history update can be derived from decoded transform coefficients themselves, as follows:

```
int rem= m_BinDecoder.decodeRemAbsEP( ricePar,
    COEF_REMAIN_BIN_REDUCTION, cctx.maxLog2TrDRange( ) );
if ((g_counterCollectStatCoeff[riceClass] > 0) && (rem > 0))
g_tempStatCoeff[riceClass] += floorLog2((uint32_t)rem);
```

In the text above, g_counterCollectStatCoeff[riceClass] indicates the number of transform coefficients in a class that the video coder has processed so far in a partition of a picture (e.g., the whole picture, slice, tile, group of CUs, etc.), where the class is indicated by index riceClass. Furthermore, in the text above, g_tempStatCoeff[riceClass] is a temporary value for the class indicated by index riceClass. Furthermore, in the text above, the function m_BinDecoder.decodeRemAbsEP implements a CABAC bypass decoding of the large part of the transform coefficient. In some examples, the smaller part of this transform coefficient is context CABAC coded and is not used to update the history counter.

In examples with history based on an accumulating transform coefficient value, this value can be stored itself. For example, the video coder may update the history based on a weighted average with a code length, e.g., as follows:

g_tempStatCoeff[riceClass]+=floorLog2((uint32_t)
rem). In some examples, the video coder may
update the history with a transform coefficient
magnitude itself, e.g., as follows: g_tempStat-
Coeff[riceClass]+=rem.

In some examples, a derivation process for updating the history (i.e., the process to update the coefficient statistic value) can take into consideration a value (e.g., level) of a decoded transform coefficient. For example, when performing the process to update the history, the video coder may process transform coefficients of a partition (e.g., TB, group of CUs, etc.) and may reject an update to the history based on a decoded transform coefficient if the decoded transform coefficient is equal to 0, or below some threshold T. The history may be used to derive Rice parameter for Exp-Golomb coding, if a transform coefficient is not coded with Exp-Golomb method, and instead coded with a context procedure, information from this transform coefficient may be irrelevant for Rice derivation. Thus, it may be advantageous not to update the history when the decoded transform coefficient is equal to 0, or below some threshold T.

In some examples, when performing the process to update the history, the video coder may process transform coefficients of a partition (e.g., TB, group of CUs, etc.) and take into consideration a spatial position of a decoded transform coefficient within a current TB, sub-block, or coding group. For instance, in some examples, the video coder does not perform a history update for a decoded transform coefficient of the DC value of the current TB. In some examples, the derivation process (i.e., the process to update the history) can be dependent on the spatial position, such that the derivation process would be altered or weighted for coefficients that belong to certain sub-blocks (e.g., coding groups), such as for transform coefficients within sub-blocks that do not belong to a DC sub-block. The DC sub-block is a sub-block of the current TB that contains the DC value of the TB.

In some examples, a single history counter can represent a weighted history for all sub-blocks/classes of the transform coefficients. In other words, there are not separate coefficient statistic value for each class.

In some examples, a derivation process for a history update value can take into consideration a type of the decoded transform coefficient. For example, the derivation process may take into consideration whether the decoded transform coefficient is partly coded through a context-based procedure (i.e., significance or greater-than-X flags, followed by the remainder coded with bypass procedure utilizing Rice method), or if the transform coefficient is coded as an absolute value. In some examples, when the history update value (e.g., statCoeff) is based on a stored Rice parameter, a Rice value for history update value can be computed for a partly context coded coefficient with an offset N targeted to cover the context-coded part of the transform coefficient:

g_tempStatCoeff[riceClass]+=floorLog2((uint32_t)
rem)+N;

In some examples, the value N in the equation above can be equal to an integer value, such as 1, 2, and so on.

Thus, in this example, a video coder may update the coefficient statistic value based on one or more transform coefficients of a TB of the video data. As part of updating the coefficient statistic value, the video coder may, for each respective transform coefficient of the one or more transform coefficients of the TB, perform a derivation process to determine a temporary value (e.g., g_tempStatCoeff). The derivation process takes into consideration which encoding procedure of a plurality of encoding procedures is used to encode the respective transform coefficient. In other words, the derivation process is determined based at least in part on which encoding procedure of a plurality of encoding procedures is used to encode the respective transform coefficient. The plurality of encoding procedures including a context-based procedure for encoding the respective transform coefficient and encoding the respective transform coefficient as an absolute value. The video coder may set the coefficient statistic value as an average of the coefficient statistic value and the temporary value. For instance, the video coder may determine:

```
int averageRiceInTU = (int)(g_tempStatCoeff[i]);
StatCoeff[i][compID] = (StatCoeff[i][compID] + averageRiceInTU) >> 1;
``` as described above.

In some examples, when the history value (i.e., the coefficient statistic value) is based on storing a transform coefficient value, the value for history update can be computed for a partly context coded coefficient through an offset or scaling targeting to cover the context coded part of the transform coefficient:

```
            g_tempStatCoeff[riceClass] += rem << M;
Or
            g_tempStatCoeff[riceClass] += rem + X;
```

In some examples, a value N in the equation above can be equal to an integer value, e.g., 0, 1, 2, and so on.

This disclosure may generally refer to "signaling" certain information, such as syntax elements. The term "signaling" may generally refer to the communication of values for syntax elements and/or other data used to decode encoded video data. That is, video encoder 200 may signal values for syntax elements in the bitstream. In general, signaling refers to generating a value in the bitstream. As noted above, source device 102 may transport the bitstream to destination device 116 substantially in real time, or not in real time, such as might occur when storing syntax elements to storage device 112 for later retrieval by destination device 116.

Figure 4A:
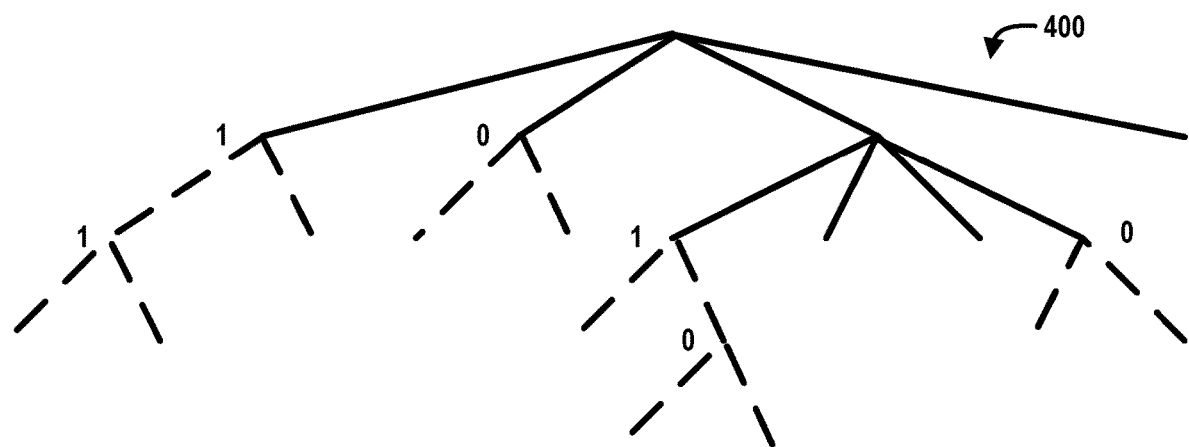
FIGS. 4A and 4B are conceptual diagrams illustrating an example quadtree binary tree (QTBT) structure, and a corresponding coding tree unit (CTU), in accordance with one or more techniques of this disclosure.
Figure 4B:
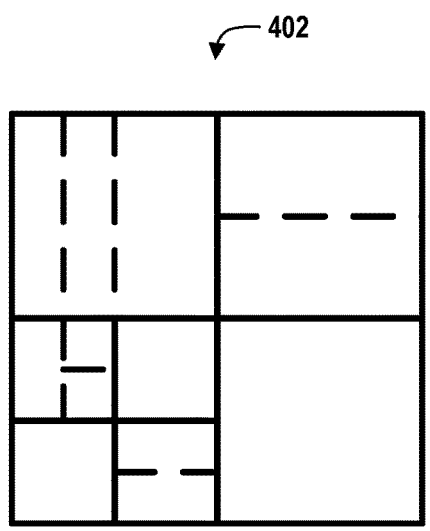

FIGS. 4A and 4B are conceptual diagrams illustrating an example quadtree binary tree (QTBT) structure 400, and a corresponding coding tree unit (CTU) 402. The solid lines represent quadtree splitting, and dotted lines indicate binary tree splitting. In each split (i.e., non-leaf) node of the binary tree, one flag is signaled to indicate which splitting type (i.e., horizontal or vertical) is used, where 0 indicates horizontal splitting and 1 indicates vertical splitting in this example. For the quadtree splitting, there is no need to indicate the splitting type, because quadtree nodes split a block horizontally and vertically into 4 sub-blocks with equal size. Accordingly, video encoder 200 may encode, and video decoder 300 may decode, syntax elements (such as splitting information) for a region tree level of QTBT structure 130 (i.e., the solid lines) and syntax elements (such as splitting information) for a prediction tree level of QTBT structure 130 (i.e., the dashed lines). Video encoder 200 may encode, and video decoder 300 may decode, video data, such as prediction and transform data, for CUs represented by terminal leaf nodes of QTBT structure 130.

In general, CTU 402 of FIG. 4B may be associated with parameters defining sizes of blocks corresponding to nodes of QTBT structure 130 at the first and second levels. These parameters may include a CTU size (representing a size of CTU 132 in samples), a minimum quadtree size (MinQTSize, representing a minimum allowed quadtree leaf node size), a maximum binary tree size (MaxBTSize, representing a maximum allowed binary tree root node size), a maximum binary tree depth (MaxBTDepth, representing a maximum allowed binary tree depth), and a minimum binary tree size (MinBTSize, representing the minimum allowed binary tree leaf node size).

The root node of a QTBT structure corresponding to a CTU may have four child nodes at the first level of the QTBT structure, each of which may be partitioned according to quadtree partitioning. That is, nodes of the first level are either leaf nodes (having no child nodes) or have four child nodes. The example of QTBT structure 130 represents such nodes as including the parent node and child nodes having solid lines for branches. If nodes of the first level are not larger than the maximum allowed binary tree root node size (MaxBTSize), then the nodes can be further partitioned by respective binary trees. The binary tree splitting of one node can be iterated until the nodes resulting from the split reach the minimum allowed binary tree leaf node size (MinBTSize) or the maximum allowed binary tree depth (MaxBTDepth). The example of QTBT structure 400 represents such nodes as having dashed lines for branches. The binary tree leaf node is referred to as a coding unit (CU), which is used for prediction (e.g., intra-picture or inter-picture prediction) and transform, without any further partitioning. As discussed above, CUs may also be referred to as "video blocks" or "blocks."

In one example of the QTBT partitioning structure, the CTU size is set as 128×128 (luma samples and two corresponding 64×64 chroma samples), the MinQTSize is set as 16×16, the MaxBTSize is set as 64×64, the MinBTSize (for both width and height) is set as 4, and the MaxBTDepth is set as 4. The quadtree partitioning is applied to the CTU first to generate quad-tree leaf nodes. The quadtree leaf nodes may have a size from 16×16 (i.e., the MinQTSize) to 128×128 (i.e., the CTU size). If the quadtree leaf node is 128×128, the leaf quadtree node will not be further split by the binary tree, because the size exceeds the MaxBTSize (i.e., 64×64, in this example). Otherwise, the quadtree leaf node will be further partitioned by the binary tree. Therefore, the quadtree leaf node is also the root node for the binary tree and has the binary tree depth as 0. When the binary tree depth reaches MaxBTDepth (4, in this example), no further splitting is permitted. A binary tree node having a width equal to MinBTSize (4, in this example) implies that no further vertical splitting (that is, dividing of the width) is permitted for that binary tree node. Similarly, a binary tree node having a height equal to MinBTSize implies no further horizontal splitting (that is, dividing of the height) is permitted for that binary tree node. As noted above, leaf nodes of the binary tree are referred to as CUs, and are further processed according to prediction and transform without further partitioning.

Figure 5:
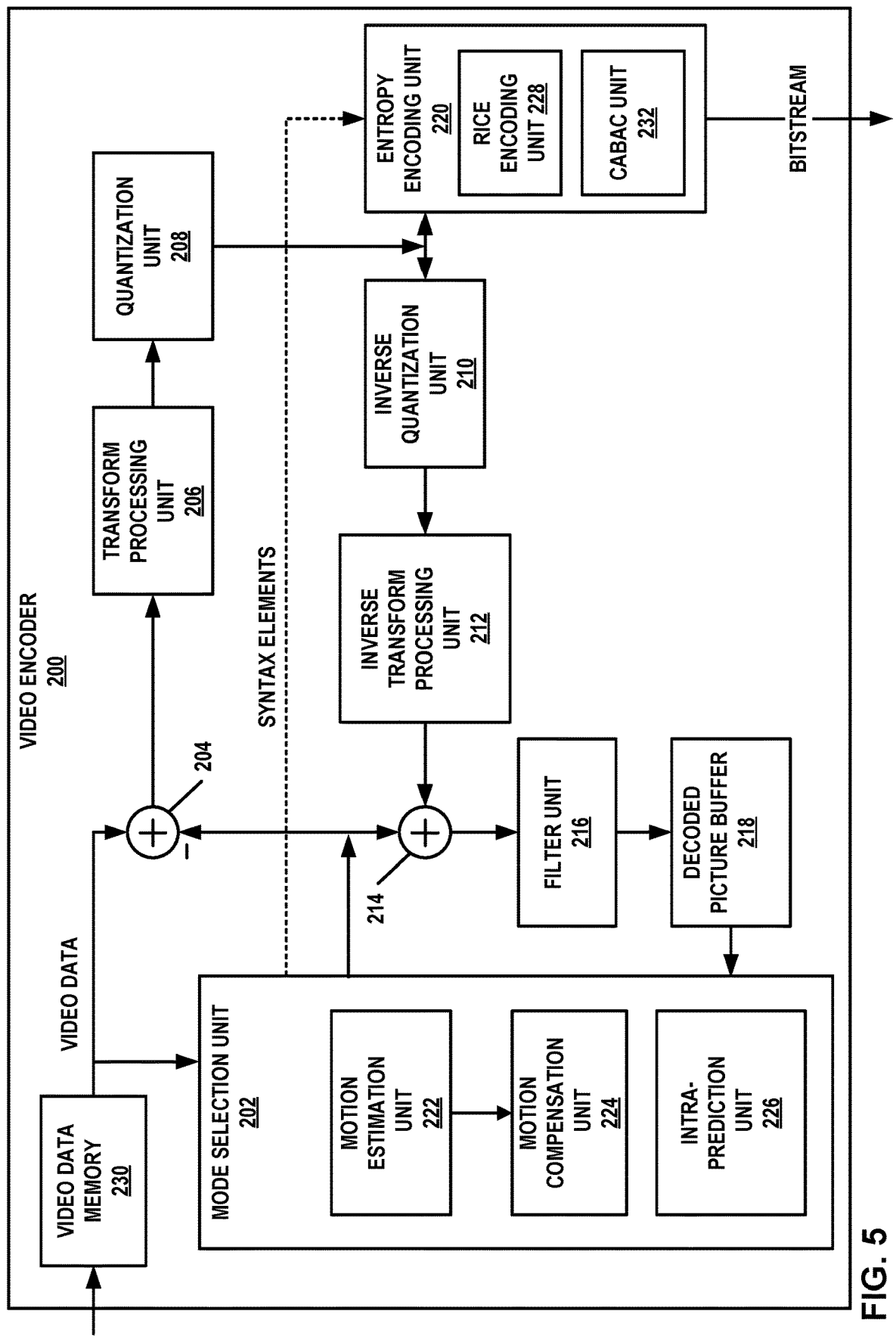
FIG. 5 is a block diagram illustrating an example video encoder that may perform the techniques of this disclosure.

FIG. 5 is a block diagram illustrating an example video encoder 200 that may perform the techniques of this disclosure. FIG. 5 is provided for purposes of explanation and should not be considered limiting of the techniques as broadly exemplified and described in this disclosure. For purposes of explanation, this disclosure describes video encoder 200 according to the techniques of VVC (ITU-T H.266, under development), and HEVC (ITU-T H.265). However, the techniques of this disclosure may be performed by video encoding devices that are configured to other video coding standards.

In the example of FIG. 5, video encoder 200 includes video data memory 230, mode selection unit 202, residual generation unit 204, transform processing unit 206, quantization unit 208, inverse quantization unit 210, inverse transform processing unit 212, reconstruction unit 214, filter unit 216, decoded picture buffer (DPB) 218, and entropy encoding unit 220. Any or all of video data memory 230, mode selection unit 202, residual generation unit 204, transform processing unit 206, quantization unit 208, inverse quantization unit 210, inverse transform processing unit 212, reconstruction unit 214, filter unit 216, DPB 218, and entropy encoding unit 220 may be implemented in one or more processors or in processing circuitry. For instance, the units of video encoder 200 may be implemented as one or more circuits or logic elements as part of hardware circuitry, or as part of a processor, ASIC, or FPGA. Moreover, video encoder 200 may include additional or alternative processors or processing circuitry to perform these and other functions. For instance, in the example of FIG. 5, entropy encoding unit 220 may include a Rice Encoding Unit (REU) 228 and a CABAC unit 232.

Video data memory 230 may store video data to be encoded by the components of video encoder 200. Video encoder 200 may receive the video data stored in video data memory 230 from, for example, video source 104 (FIG. 1). DPB 218 may act as a reference picture memory that stores reference video data for use in prediction of subsequent video data by video encoder 200. Video data memory 230 and DPB 218 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 230 and DPB 218 may be provided by the same memory device or separate memory devices. In various examples, video data memory 230 may be on-chip with other components of video encoder 200, as illustrated, or off-chip relative to those components.

In this disclosure, reference to video data memory 230 should not be interpreted as being limited to memory internal to video encoder 200, unless specifically described as such, or memory external to video encoder 200, unless specifically described as such. Rather, reference to video data memory 230 should be understood as reference memory that stores video data that video encoder 200 receives for encoding (e.g., video data for a current block that is to be encoded). Memory 106 of FIG. 1 may also provide temporary storage of outputs from the various units of video encoder 200.

The various units of FIG. 5 are illustrated to assist with understanding the operations performed by video encoder 200. The units may be implemented as fixed-function circuits, programmable circuits, or a combination thereof. Fixed-function circuits refer to circuits that provide particular functionality, and are preset on the operations that can be performed. Programmable circuits refer to circuits that can be programmed to perform various tasks, and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, one or more of the units may be distinct circuit blocks (fixed-function or programmable), and in some examples, one or more of the units may be integrated circuits.

Video encoder 200 may include arithmetic logic units (ALUs), elementary function units (EFUs), digital circuits, analog circuits, and/or programmable cores, formed from programmable circuits. In examples where the operations of video encoder 200 are performed using software executed by the programmable circuits, memory 106 (FIG. 1) may store the instructions (e.g., object code) of the software that video encoder 200 receives and executes, or another memory within video encoder 200 (not shown) may store such instructions.

Video data memory 230 is configured to store received video data. Video encoder 200 may retrieve a picture of the video data from video data memory 230 and provide the video data to residual generation unit 204 and mode selection unit 202. Video data in video data memory 230 may be raw video data that is to be encoded.

Mode selection unit 202 includes a motion estimation unit 222, a motion compensation unit 224, and an intra-prediction unit 226. Mode selection unit 202 may include additional functional units to perform video prediction in accordance with other prediction modes. As examples, mode selection unit 202 may include a palette unit, an intra-block copy unit (which may be part of motion estimation unit 222 and/or motion compensation unit 224), an affine unit, a linear model (LM) unit, or the like.

Mode selection unit 202 generally coordinates multiple encoding passes to test combinations of encoding parameters and resulting rate-distortion values for such combinations. The encoding parameters may include partitioning of CTUs into CUs, prediction modes for the CUs, transform types for residual data of the CUs, quantization parameters for residual data of the CUs, and so on. Mode selection unit 202 may ultimately select the combination of encoding parameters having rate-distortion values that are better than the other tested combinations.

Video encoder 200 may partition a picture retrieved from video data memory 230 into a series of CTUs, and encapsulate one or more CTUs within a slice. Mode selection unit 202 may partition a CTU of the picture in accordance with a tree structure, such as the QTBT structure or the quad-tree structure of HEVC described above. As described above, video encoder 200 may form one or more CUs from partitioning a CTU according to the tree structure. Such a CU may also be referred to generally as a "video block" or "block."

In general, mode selection unit 202 also controls the components thereof (e.g., motion estimation unit 222, motion compensation unit 224, and intra-prediction unit 226) to generate a prediction block for a current block (e.g., a current CU, or in HEVC, the overlapping portion of a PU and a TB). For inter-prediction of a current block, motion estimation unit 222 may perform a motion search to identify one or more closely matching reference blocks in one or more reference pictures (e.g., one or more previously coded pictures stored in DPB 218). In particular, motion estimation unit 222 may calculate a value representative of how similar a potential reference block is to the current block, e.g., according to sum of absolute difference (SAD), sum of squared differences (SSD), mean absolute difference (MAD), mean squared differences (MSD), or the like. Motion estimation unit 222 may generally perform these calculations using sample-by-sample differences between the current block and the reference block being considered. Motion estimation unit 222 may identify a reference block having a lowest value resulting from these calculations, indicating a reference block that most closely matches the current block.

Motion estimation unit 222 may form one or more motion vectors (MVs) that defines the positions of the reference blocks in the reference pictures relative to the position of the current block in a current picture. Motion estimation unit 222 may then provide the motion vectors to motion compensation unit 224. For example, for uni-directional inter-prediction, motion estimation unit 222 may provide a single motion vector, whereas for bi-directional inter-prediction, motion estimation unit 222 may provide two motion vectors. Motion compensation unit 224 may then generate a prediction block using the motion vectors. For example, motion compensation unit 224 may retrieve data of the reference block using the motion vector. As another example, if the motion vector has fractional sample precision, motion compensation unit 224 may interpolate values for the prediction block according to one or more interpolation filters. Moreover, for bi-directional inter-prediction, motion compensation unit 224 may retrieve data for two reference blocks identified by respective motion vectors and combine the retrieved data, e.g., through sample-by-sample averaging or weighted averaging.

As another example, for intra-prediction, or intra-prediction coding, intra-prediction unit 226 may generate the prediction block from samples neighboring the current block. For example, for directional modes, intra-prediction unit 226 may generally mathematically combine values of neighboring samples and populate these calculated values in the defined direction across the current block to produce the prediction block. As another example, for DC mode, intra-prediction unit 226 may calculate an average of the neighboring samples to the current block and generate the prediction block to include this resulting average for each sample of the prediction block.

Mode selection unit 202 provides the prediction block to residual generation unit 204. Residual generation unit 204 receives a raw, unencoded version of the current block from video data memory 230 and the prediction block from mode selection unit 202. Residual generation unit 204 calculates sample-by-sample differences between the current block and the prediction block. The resulting sample-by-sample differences define a residual block for the current block. In some examples, residual generation unit 204 may also determine differences between sample values in the residual block to generate a residual block using residual differential pulse code modulation (RDPCM). In some examples, residual generation unit 204 may be formed using one or more subtractor circuits that perform binary subtraction.

In examples where mode selection unit 202 partitions CUs into PUs, each PU may be associated with a luma prediction unit and corresponding chroma prediction units. Video encoder 200 and video decoder 300 may support PUs having various sizes. As indicated above, the size of a CU may refer to the size of the luma coding block of the CU and the size of a PU may refer to the size of a luma prediction unit of the PU. Assuming that the size of a particular CU is 2N×2N, video encoder 200 may support PU sizes of 2N×2N or N×N for intra prediction, and symmetric PU sizes of 2N×2N, 2N×N, N×2N, N×N, or similar for inter prediction. Video encoder 200 and video decoder 300 may also support asymmetric partitioning for PU sizes of 2N×nU, 2N×nD, nL×2N, and nR×2N for inter prediction.

In examples where mode selection unit 202 does not further partition a CU into PUs, each CU may be associated with a luma coding block and corresponding chroma coding blocks. As above, the size of a CU may refer to the size of the luma coding block of the CU. The video encoder 200 and video decoder 300 may support CU sizes of 2N×2N, 2N×N, or N×2N.

For other video coding techniques such as an intra-block copy mode coding, an affine-mode coding, and linear model (LM) mode coding, as some examples, mode selection unit 202, via respective units associated with the coding techniques, generates a prediction block for the current block being encoded. In some examples, such as palette mode coding, mode selection unit 202 may not generate a prediction block, and instead generate syntax elements that indicate the manner in which to reconstruct the block based on a selected palette. In such modes, mode selection unit 202 may provide these syntax elements to entropy encoding unit 220 to be encoded.

As described above, residual generation unit 204 receives the video data for the current block and the corresponding prediction block. Residual generation unit 204 then generates a residual block for the current block. To generate the residual block, residual generation unit 204 calculates sample-by-sample differences between the prediction block and the current block.

Transform processing unit 206 applies one or more transforms to the residual block to generate a block of transform coefficients (referred to herein as a "transform coefficient block"). Transform processing unit 206 may apply various transforms to a residual block to form the transform coefficient block. For example, transform processing unit 206 may apply a discrete cosine transform (DCT), a directional transform, a Karhunen-Loeve transform (KLT), or a conceptually similar transform to a residual block. In some examples, transform processing unit 206 may perform multiple transforms to a residual block, e.g., a primary transform and a secondary transform, such as a rotational transform. In some examples, transform processing unit 206 does not apply transforms to a residual block.

Quantization unit 208 may quantize the transform coefficients in a transform coefficient block, to produce a quantized transform coefficient block. Quantization unit 208 may quantize transform coefficients of a transform coefficient block according to a quantization parameter (QP) value associated with the current block. Video encoder 200 (e.g., via mode selection unit 202) may adjust the degree of quantization applied to the transform coefficient blocks associated with the current block by adjusting the QP value associated with the CU. Quantization may introduce loss of information, and thus, quantized transform coefficients may have lower precision than the original transform coefficients produced by transform processing unit 206.

Inverse quantization unit 210 and inverse transform processing unit 212 may apply inverse quantization and inverse transforms to a quantized transform coefficient block, respectively, to reconstruct a residual block from the transform coefficient block. Reconstruction unit 214 may produce a reconstructed block corresponding to the current block (albeit potentially with some degree of distortion) based on the reconstructed residual block and a prediction block generated by mode selection unit 202. For example, reconstruction unit 214 may add samples of the reconstructed residual block to corresponding samples from the prediction block generated by mode selection unit 202 to produce the reconstructed block.

Filter unit 216 may perform one or more filter operations on reconstructed blocks. For example, filter unit 216 may perform deblocking operations to reduce blockiness artifacts along edges of CUs. Operations of filter unit 216 may be skipped, in some examples.

Video encoder 200 stores reconstructed blocks in DPB 218. For instance, in examples where operations of filter unit 216 are not performed, reconstruction unit 214 may store reconstructed blocks to DPB 218. In examples where operations of filter unit 216 are performed, filter unit 216 may store the filtered reconstructed blocks to DPB 218. Motion estimation unit 222 and motion compensation unit 224 may retrieve a reference picture from DPB 218, formed from the reconstructed (and potentially filtered) blocks, to inter-predict blocks of subsequently encoded pictures. In addition, intra-prediction unit 226 may use reconstructed blocks in DPB 218 of a current picture to intra-predict other blocks in the current picture.

In general, entropy encoding unit 220 may entropy encode syntax elements received from other functional components of video encoder 200. For example, entropy encoding unit 220 may entropy encode quantized transform coefficient blocks from quantization unit 208. As another example, entropy encoding unit 220 may entropy encode prediction syntax elements (e.g., motion information for inter-prediction or intra-mode information for intra-prediction) from mode selection unit 202. Entropy encoding unit 220 may perform one or more entropy encoding operations on the syntax elements, which are another example of video data, to generate entropy-encoded data. For example, entropy encoding unit 220 may perform a context-adaptive variable length coding (CAVLC) operation, a CABAC operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. In some examples, entropy encoding unit 220 may operate in bypass mode where syntax elements are not entropy encoded.

REU 228 may generate Rice codes for some syntax elements, such as remainder syntax elements (e.g., abs_remainder) for transform coefficients and absolute value syntax elements (e.g., dec_abs_level) for transform coefficients. CABAC unit 232 of entropy encoding unit 220 may perform CABAC coding or another type of entropy encoding on the Rice codes. As part of generating a Rice code for a syntax element for a transform coefficient, REU 228 may determine a Rice parameter for the transform coefficient. REU 228 may determine the Rice parameter for the transform coefficient in accordance with any of the techniques of this disclosure. For instance, REU 228 may determine a history value (e.g., histCoef) for a transform coefficient. The history value may also be referred to herein as an estimated historic transform coefficient. REU 228 may determine the history value based on a coefficient statistic value. As described elsewhere in this disclosure, REU 228 may update the coefficient statistic value to an average of the coefficient statistic value and a temporary value. REU 228 may perform a derivation process to determine the temporary value. The derivation process may take into consideration which encoding procedure of a plurality of encoding procedures is used to encode the respective transform coefficient. The plurality of encoding procedures includes a context-based procedure for encoding the respective transform coefficient and encoding the respective transform coefficient as an absolute value.

Video encoder 200 may output a bitstream that includes the entropy encoded syntax elements needed to reconstruct blocks of a slice or picture. In particular, entropy encoding unit 220 may output the bitstream.

The operations described above are described with respect to a block. Such description should be understood as being operations for a luma coding block and/or chroma coding blocks. As described above, in some examples, the luma coding block and chroma coding blocks are luma and chroma components of a CU. In some examples, the luma coding block and the chroma coding blocks are luma and chroma components of a PU.

In some examples, operations performed with respect to a luma coding block need not be repeated for the chroma coding blocks. As one example, operations to identify a motion vector (MV) and reference picture for a luma coding block need not be repeated for identifying a MV and reference picture for the chroma blocks. Rather, the MV for the luma coding block may be scaled to determine the MV for the chroma blocks, and the reference picture may be the same. As another example, the intra-prediction process may be the same for the luma coding block and the chroma coding blocks.

In some examples, video encoder 200 represents an example of a device configured to encode video data including a memory configured to store video data, and one or more processing units implemented in circuitry and configured to determine an estimated historic transform coefficient (e.g., histCoef) for a current transform coefficient; determine, based on the estimated historic transform coefficient, a local sum value (e.g., localSumAbs); determine a Rice parameter (e.g., cRiceParam) based on the local sum value; determine a syntax element (e.g., abs_remainder or dec_abs_level) based on a level of the current transform coefficient; and use the Rice parameter to encode the syntax element.

Figure 6:
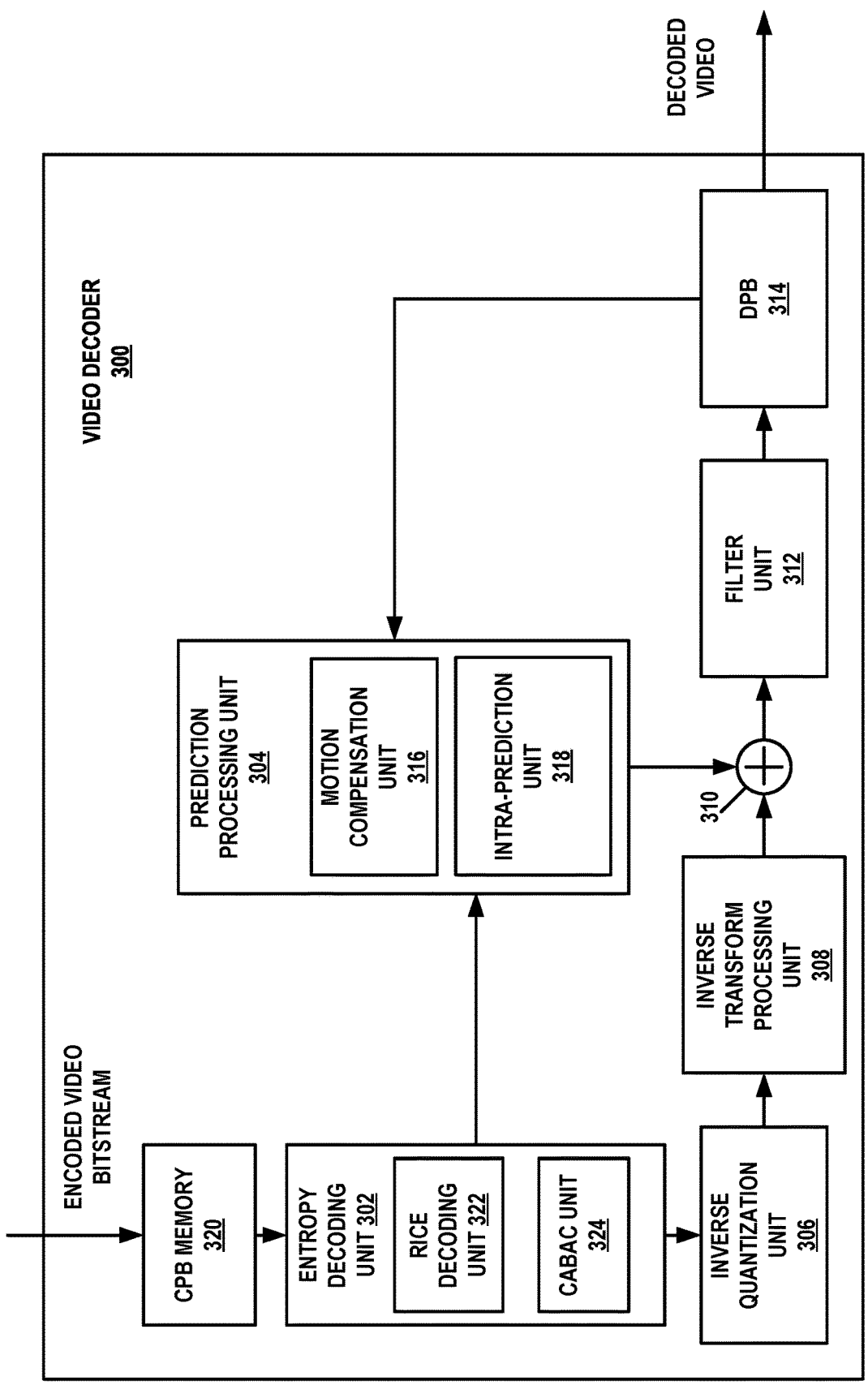
FIG. 6 is a block diagram illustrating an example video decoder that may perform the techniques of this disclosure.

FIG. 6 is a block diagram illustrating an example video decoder 300 that may perform the techniques of this disclosure. FIG. 6 is provided for purposes of explanation and is not limiting on the techniques as broadly exemplified and described in this disclosure. For purposes of explanation, this disclosure describes video decoder 300 according to the techniques of VVC (ITU-T H.266, under development), and HEVC (ITU-T H.265). However, the techniques of this disclosure may be performed by video coding devices that are configured to other video coding standards.

In the example of FIG. 6, video decoder 300 includes coded picture buffer (CPB) memory 320, entropy decoding unit 302, prediction processing unit 304, inverse quantization unit 306, inverse transform processing unit 308, reconstruction unit 310, filter unit 312, and decoded picture buffer (DPB) 314. Any or all of CPB memory 320, entropy decoding unit 302, prediction processing unit 304, inverse quantization unit 306, inverse transform processing unit 308, reconstruction unit 310, filter unit 312, and DPB 314 may be implemented in one or more processors or in processing circuitry. For instance, the units of video decoder 300 may be implemented as one or more circuits or logic elements as part of hardware circuitry, or as part of a processor, ASIC, or FPGA. Moreover, video decoder 300 may include additional or alternative processors or processing circuitry to perform these and other functions. For instance, in the example of FIG. 6, entropy decoding unit 302 includes a Rice Decoding Unit (RDU) 322 and a CABAC unit 324.

Prediction processing unit 304 includes motion compensation unit 316 and intra-prediction unit 318. Prediction processing unit 304 may include additional units to perform prediction in accordance with other prediction modes. As examples, prediction processing unit 304 may include a palette unit, an intra-block copy unit (which may form part of motion compensation unit 316), an affine unit, a linear model (LM) unit, or the like. In other examples, video decoder 300 may include more, fewer, or different functional components.

CPB memory 320 may store video data, such as an encoded video bitstream, to be decoded by the components of video decoder 300. The video data stored in CPB memory 320 may be obtained, for example, from computer-readable medium 110 (FIG. 1). CPB memory 320 may include a CPB that stores encoded video data (e.g., syntax elements) from an encoded video bitstream. Also, CPB memory 320 may store video data other than syntax elements of a coded picture, such as temporary data representing outputs from the various units of video decoder 300. DPB 314 generally stores decoded pictures, which video decoder 300 may output and/or use as reference video data when decoding subsequent data or pictures of the encoded video bitstream. CPB memory 320 and DPB 314 may be formed by any of a variety of memory devices, such as DRAM, including SDRAM, MRAM, RRAM, or other types of memory devices. CPB memory 320 and DPB 314 may be provided by the same memory device or separate memory devices. In various examples, CPB memory 320 may be on-chip with other components of video decoder 300, or off-chip relative to those components.

Additionally or alternatively, in some examples, video decoder 300 may retrieve coded video data from memory 120 (FIG. 1). That is, memory 120 may store data as discussed above with CPB memory 320. Likewise, memory 120 may store instructions to be executed by video decoder 300, when some or all of the functionality of video decoder 300 is implemented in software to be executed by processing circuitry of video decoder 300.

The various units shown in FIG. 6 are illustrated to assist with understanding the operations performed by video decoder 300. The units may be implemented as fixed-function circuits, programmable circuits, or a combination thereof. Similar to FIG. 5, fixed-function circuits refer to circuits that provide particular functionality, and are preset on the operations that can be performed. Programmable circuits refer to circuits that can be programmed to perform various tasks, and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, one or more of the units may be distinct circuit blocks (fixed-function or programmable), and in some examples, one or more of the units may be integrated circuits.

Video decoder 300 may include ALUs, EFUs, digital circuits, analog circuits, and/or programmable cores formed from programmable circuits. In examples where the operations of video decoder 300 are performed by software executing on the programmable circuits, on-chip or off-chip memory may store instructions (e.g., object code) of the software that video decoder 300 receives and executes.

Entropy decoding unit 302 may receive encoded video data from the CPB and entropy decode the video data to reproduce syntax elements. Prediction processing unit 304, inverse quantization unit 306, inverse transform processing unit 308, reconstruction unit 310, and filter unit 312 may generate decoded video data based on the syntax elements extracted from the bitstream.

In general, video decoder 300 reconstructs a picture on a block-by-block basis. Video decoder 300 may perform a reconstruction operation on each block individually (where the block currently being reconstructed, i.e., decoded, may be referred to as a "current block").

Entropy decoding unit 302 may entropy decode syntax elements defining quantized transform coefficients of a quantized transform coefficient block, as well as transform information, such as a quantization parameter (QP) and/or transform mode indication(s). Inverse quantization unit 306 may use the QP associated with the quantized transform coefficient block to determine a degree of quantization and, likewise, a degree of inverse quantization for inverse quantization unit 306 to apply. Inverse quantization unit 306 may, for example, perform a bitwise left-shift operation to inverse quantize the quantized transform coefficients. Inverse quantization unit 306 may thereby form a transform coefficient block including transform coefficients.

Some syntax elements may be represented as Rice codes. In some such examples, CABAC unit 324 may apply CABAC decoding or another form of entropy decoding to a bit sequence in the bitstream to obtain a Rice code for a syntax element, such as a remainder syntax element (e.g., abs_remainder) for a transform coefficient or an absolute value syntax element (e.g., dec_abs_level) for the transform coefficient. In the example of FIG. 6, RDU 322 of entropy decoding unit 302 may decode the Rice code and use the resulting decoded value to determine a level of the transform coefficient. RDU 322 may determine a Rice parameter to use in decoding the Rice code in accordance with any of the techniques of this disclosure.

After inverse quantization unit 306 forms the transform coefficient block, inverse transform processing unit 308 may apply one or more inverse transforms to the transform coefficient block to generate a residual block associated with the current block. For example, inverse transform processing unit 308 may apply an inverse DCT, an inverse integer transform, an inverse Karhunen-Loeve transform (KLT), an inverse rotational transform, an inverse directional transform, or another inverse transform to the transform coefficient block.

Furthermore, prediction processing unit 304 generates a prediction block according to prediction information syntax elements that were entropy decoded by entropy decoding unit 302. For example, if the prediction information syntax elements indicate that the current block is inter-predicted, motion compensation unit 316 may generate the prediction block. In this case, the prediction information syntax elements may indicate a reference picture in DPB 314 from which to retrieve a reference block, as well as a motion vector identifying a location of the reference block in the reference picture relative to the location of the current block in the current picture. Motion compensation unit 316 may generally perform the inter-prediction process in a manner that is substantially similar to that described with respect to motion compensation unit 224 (FIG. 5).

As another example, if the prediction information syntax elements indicate that the current block is intra-predicted, intra-prediction unit 318 may generate the prediction block according to an intra-prediction mode indicated by the prediction information syntax elements. Again, intra-prediction unit 318 may generally perform the intra-prediction process in a manner that is substantially similar to that described with respect to intra-prediction unit 226 (FIG. 5). Intra-prediction unit 318 may retrieve data of neighboring samples to the current block from DPB 314.

Reconstruction unit 310 may reconstruct the current block using the prediction block and the residual block. For example, reconstruction unit 310 may add samples of the residual block to corresponding samples of the prediction block to reconstruct the current block.

Filter unit 312 may perform one or more filter operations on reconstructed blocks. For example, filter unit 312 may perform deblocking operations to reduce blockiness artifacts along edges of the reconstructed blocks. Operations of filter unit 312 are not necessarily performed in all examples.

Video decoder 300 may store the reconstructed blocks in DPB 314. For instance, in examples where operations of filter unit 312 are not performed, reconstruction unit 310 may store reconstructed blocks to DPB 314. In examples where operations of filter unit 312 are performed, filter unit 312 may store the filtered reconstructed blocks to DPB 314. As discussed above, DPB 314 may provide reference information, such as samples of a current picture for intra-prediction and previously decoded pictures for subsequent motion compensation, to prediction processing unit 304. Moreover, video decoder 300 may output decoded pictures (e.g., decoded video) from DPB 314 for subsequent presentation on a display device, such as display device 118 of FIG. 1.

In this manner, video decoder 300 may represent an example of a video decoding device including a memory configured to store video data, and one or more processing units implemented in circuitry and configured to determine an estimated historic transform coefficient (e.g., histCoef) for a current transform coefficient; determine, based on the estimated historic transform coefficient, a local sum value (e.g., localSumAbs); determine a Rice parameter (e.g., cRiceParam) based on the local sum value; use the Rice parameter to decode a syntax element (e.g., abs_remainder or dec_abs_level); determine a level of the current transform coefficient based on the syntax element; and reconstruct a block of the video data based on the level of the current transform coefficient.

Figure 7:
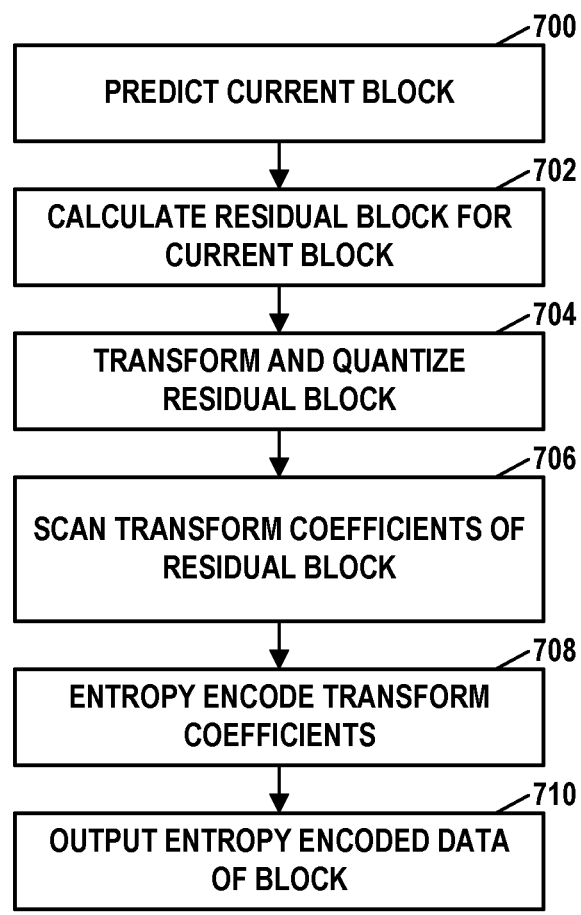
FIG. 7 is a flowchart illustrating an example method for encoding a current block in accordance with the techniques of this disclosure.

FIG. 7 is a flowchart illustrating an example method for encoding a current block in accordance with the techniques of this disclosure. The flowcharts of this disclosure are provided as examples. In other examples, more, fewer, or different actions may be included in the methods, and the actions shown in the flowcharts may be performed in different orders. Furthermore, the methods shown in the flowcharts of this disclosure are described with respect to FIG. 1 through FIG. 6, but the methods are not so limited. In the example of FIG. 7, the current block may comprise a current CU.

In this example, video encoder 200 initially predicts the current block (700). For example, video encoder 200 may form a prediction block for the current block. Video encoder 200 may then calculate a residual block for the current block (702). To calculate the residual block, video encoder 200 may calculate a difference between the original, unencoded block and the prediction block for the current block. Video encoder 200 may then transform the residual block and quantize transform coefficients of the residual block (704). Next, video encoder 200 may scan the quantized transform coefficients of the residual block (706). During the scan, or following the scan, video encoder 200 may entropy encode the transform coefficients (708). For example, video encoder 200 may encode the transform coefficients using CAVLC or CABAC. Video encoder 200 may then output the entropy encoded data of the block (710).

As part of entropy encoding a transform coefficient, video encoder 200 may determine a Rice parameter for the transform coefficient in accordance with any of the techniques of this disclosure. Video encoder 200 may generate a Rice code for the transform coefficient based on the Rice parameter and a level of the transform coefficient. Video encoder 200 may entropy encode the Rice code.

Figure 8:
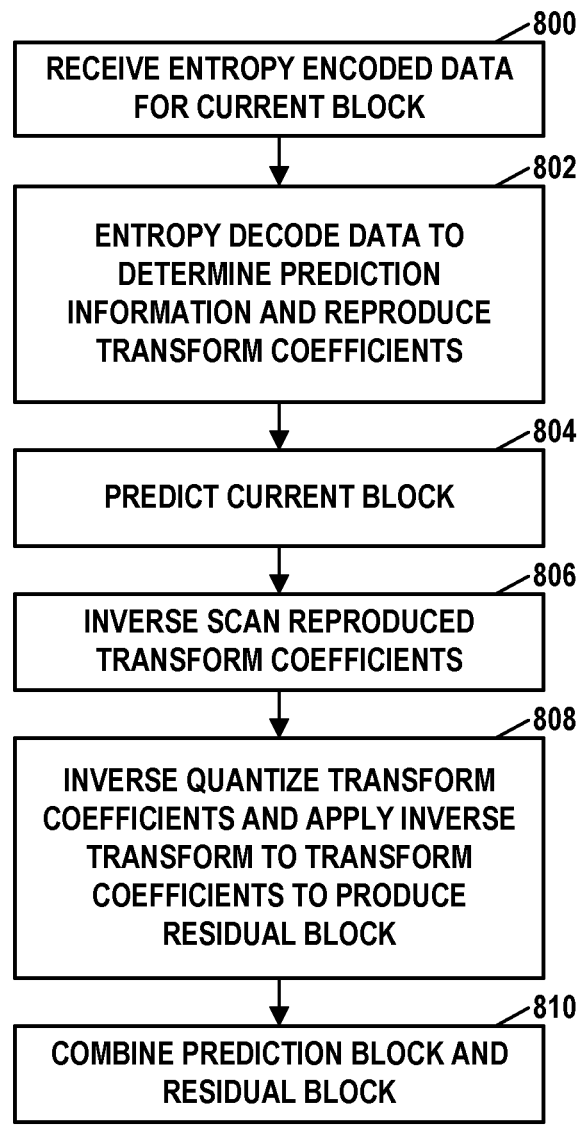
FIG. 8 is a flowchart illustrating an example method for decoding a current block in accordance with the techniques of this disclosure.

FIG. 8 is a flowchart illustrating an example method for decoding a current block of video data in accordance with the techniques of this disclosure. The current block may comprise a current CU. Although described with respect to video decoder 300 (FIGS. 1 and 6), it should be understood that other devices may be configured to perform a method similar to that of FIG. 8.

Video decoder 300 may receive entropy encoded data for the current block, such as entropy encoded prediction information and entropy encoded data for transform coefficients of a residual block corresponding to the current block (800). Video decoder 300 may entropy decode the entropy encoded data to determine prediction information for the current block and to reproduce transform coefficients of the residual block (802).

Video decoder 300 may determine Rice parameters for one or more of the transform coefficients in accordance with any of the techniques of this disclosure. Video decoder 300 may determine a level of a transform coefficient based on the Rice parameter for the transform coefficient and one or more syntax elements encoded in a bitstream. For example, video decoder 300 may entropy decode a remainder syntax element (e.g., abs_remainder) to obtain a Rice code for the transform coefficient. In this example, video decoder 300 may then use the Rice parameter for the transform coefficient to decode the Rice code to obtain a decoded value. Video decoder 300 may use the decoded value to determine a level of the transform coefficient.

Video decoder 300 may predict the current block (804), e.g., using an intra- or inter-prediction mode as indicated by the prediction information for the current block, to calculate a prediction block for the current block. Video decoder 300 may then inverse scan the reproduced transform coefficients (806), to create a block of quantized transform coefficients. Video decoder 300 may then inverse quantize the transform coefficients and apply an inverse transform to the transform coefficients to produce a residual block (808). Video decoder 300 may ultimately decode the current block by combining the prediction block and the residual block (810).

Figure 9:
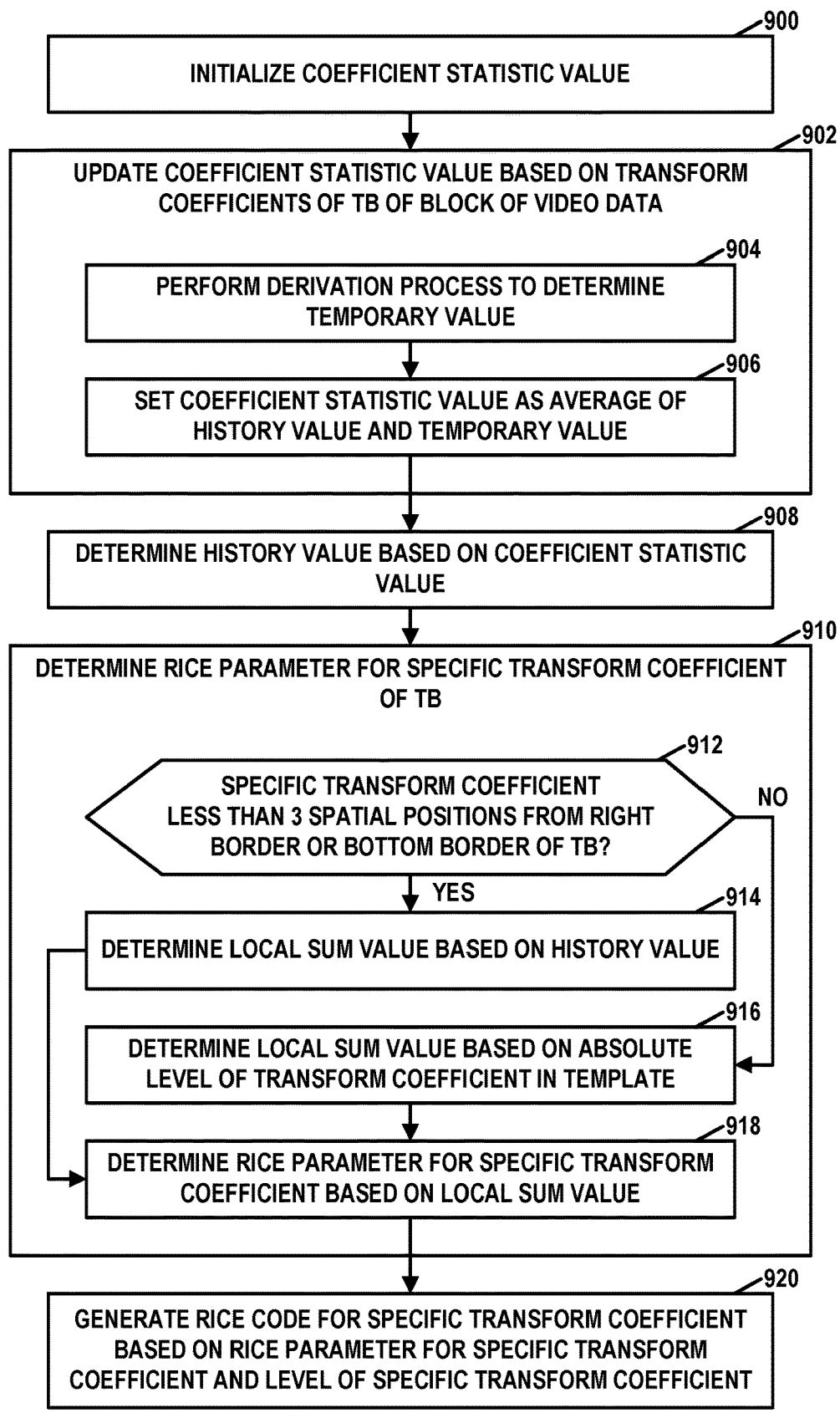
FIG. 9 is a flowchart illustrating an example process for encoding video data in accordance with one or more techniques of this disclosure.

FIG. 9 is a flowchart illustrating an example process for encoding video data in accordance with one or more techniques of this disclosure. In the example of FIG. 9, REU 228 initializes a coefficient statistic value (e.g., statCoeff[i][compID]) (900). For example, REU 228 may initialize the coefficient statistic value to 0. In some examples, REU 228 may initialize the coefficient statistic value to a default history value (e.g., DefaultHistoryRiceValue).

In some examples, REU 228 may determine a default history value based on a QP of a slice of a picture that includes the block of the video data. For instance, where "DefaultHistoryRiceValue" indicates the default history value, "bitDepth" indicates the bit depth of the transform coefficients of a TB, and "cs.slice->getSliceQp( )" is a function that returns the QP of the slice, REU 228 may perform the following operation to determine the default history value:

$$\text{DefaultHistoryRiceValue} = (\text{bitDepth} - 10) > 0 \;?\; (\text{int})(\text{OFFSET} - \text{cs.slice->getSliceQp}( ) * \text{MULTIPLIER}) : 0;$$
$$\text{DefaultHistoryRiceValue} = \text{DefaultHistoryRiceValue} < 0 \;?\; 0 : \text{DefaultHistoryRiceValue};$$

REU 228 may reset the coefficient statistic value to the default history value at a start of a partitioning of the picture. For example, REU 228 may maintain the coefficient statistic value through a certain partition of the decoded picture (e.g., full picture, slice, tile, group of CTUs, or a single CTU) with normative reset at the start of the partition.

Furthermore, in the example of FIG. 9, REU 228 may update the coefficient statistic value based on one or more transform coefficients of a transform block (TB) of a block of the video data (902). The block of the video data may be a CU or other type of block. The one or more transform coefficient may be all of the transform coefficients of the TB or a subset of the transform coefficients of the TB. As shown in the example of FIG. 9, as part of updating the coefficient statistic value, REU 228 may, for each respective transform coefficient of the one or more transform coefficients of the TB, perform a derivation process to determine a temporary value (904).

The derivation process takes into consideration (i.e., is determined based at least in part on) which encoding procedure of a plurality of encoding procedures is used to encode the respective transform coefficient. The plurality of encoding procedures includes a context-based procedure for encoding the respective transform coefficient and encoding the respective transform coefficient as an absolute value. When the respective transform coefficient is encoded using the context-based procedure for encoding, the respective transform coefficient may be represented using a greater-than-1 flag, optionally a greater-than-2 flag, and a remainder. The remainder may be equal to the absolute level of the respective transform coefficient minus 2 if the greater-than-2 flag is present and equal to 1. The remainder may be equal to the absolute level of the respective transform coefficient minus 1 if the greater-than-1 flag is equal to 1 and the greater-than-2 flag is equal to 0. When the respective transform coefficient is encoded as an absolute value, the respective transform coefficient may be equal to the absolute value or equal to the absolute value plus 1. A syntax element dec_abs_level may indicate the absolute value.

In instances where the respective transform coefficient is encoded using the context-based procedure, REU 228 may determine the temporary value based on applying a floor function to a log-base-2 value of a remainder value of the respective transform coefficient, and adding an integer value. For instance, where g_tempStatCoeff[riceClass] is the temporary value, "rem" is a remainder for the respective transform coefficient, and "N" is the integer value, REU 228 may calculate:

```
g_tempStatCoeff[riceClass]+=floorLog2((uint32_t)
    rem)+N;
```

In this operation and elsewhere in this disclosure, "(unit32_t)" indicates casting "rem" to an unsigned 32-bit integer.

In other instances, such as when the respective transform coefficient is encoded as an absolute value, where the respective transform coefficient is encoded using an absolute value, REU 228 may determine the temporary value based on applying a floor function to a log-base-2 value of an absolute level of the respective transform coefficient. For instance, where g_tempStatCoeff[riceClass] is the temporary value, and "rem" is a remainder for the respective transform coefficient, REU 228 may calculate:

```
g_tempStatCoeff[riceClass]+=floorLog2((uint32_t)
    rem)
```

Additionally, as part of updating the coefficient statistic value, REU 228 may set the coefficient statistic value as an average of the coefficient statistic value and the temporary value (906). For example, tempStatCoeff[i] may indicate the temporary value and StatCoeff[i][compID] may indicate the coefficient statistic value. In this example, to set the coefficient statistic value as an average of the coefficient statistic value and the temporary value, REU 228 may perform the following operations:

```
int averageRiceInTU = (int)(g_tempStatCoeff[i]);
StatCoeff[i][compID] = (StatCoeff[i][compID] + averageRiceInTU) >> 1;
```

Furthermore, in the example of FIG. 9, REU 228 may determine a history value (e.g., histCoef) based on the coefficient statistic value (908). In some examples, REU 228 may store the coefficient statistic value as a derivative of a Rice parameter. In such examples, as part of determining the history value based on the coefficient statistic value, REU 228 may left shift 1 by the coefficient statistic value. For instance, REU 228 may perform the following operations to determine the history value based on the coefficient statistic value:

```
historyRiceValue = StatCoeff[i][compID];
histCoef = 1 << historyRiceValue;
```

In another example, REU 228 may store the coefficient statistic value as a derivative of a transform coefficient. In this example, as part of determining the history value based on the coefficient statistic value, REU 228 may set the history value equal to the coefficient statistic value. For instance, REU 228 may perform the following operations to determine the history value based on the coefficient statistic value:

```
historyValue = StatCoeff[i][compID];
histCoef = historyValue;
```

In the example of FIG. 9, REU 228 may determine a Rice parameter for a specific transform coefficient of the TB (910). The specific transform coefficient of the TB may be any of the transform coefficients of the TB. In some examples, REU 228 may determine a Rice parameter for each transform coefficient of the TB.

As part of determining the Rice parameter for the specific transform coefficient comprises, REU 228 may determine whether the specific transform coefficient is less than 3 spatial positions from a right border or a bottom border of the TB (912). For example, "posX" may indicate an x-axis coordinate of the specific transform coefficient, "posY" may indicate a y-axis coordinate of the specific transform coefficient, "m_width" indicate the width of the TB, "in height" may indicate the height of the TB, "sum" may indicate a local sum value, "abs(pData[ ])" indicates an absolute level of a transform coefficient, and "histCoef" indicates the history value. In this example, REU 228 may determine whether the specific transform coefficient is less than 3 spatial positions from the right border or the bottom border of the TB using one of the following comparisons shown in Code Listing 3:

```
if (posX < m_width − 1
if (posX < m_width − 2)
if (posY < m_height − 1)
if (posY < m_height − 1)
if (posY < m_height − 2)
```

As shown in the example of FIG. 9, based on the specific transform coefficient being less than three spatial positions away from a right border of the TB or a bottom border of the TB ("YES" branch of 912), REU 228 may determine a local sum value based on the history value (914). For example, as shown in Code Listing 3, REU 228 may determine the local sum value as one of:

```
sum += histCoef
sum += N * histCoef
sum += M * histCoef
```

On the other hand, if the specific transform coefficient being not less than three spatial positions away from a right border of the TB or a bottom border of the TB ("NO" branch of 912), REU 228 may determine the local sum value based on a transform coefficient in a template (916). For example, as shown in pseudo-code listing 3, REU 228 may determine the local sum value as one of:

```
sum += abs(pData[2]);
sum += abs(pData[m_width + 1]);
sum += abs(pData[m_width]);
sum += abs(pData[m_width << 1]);
```

Furthermore, REU 228 may determine the Rice parameter for the specific transform coefficient based on the local sum value (918). For example, REU 228 may use the local sum value to look up the Rice parameter for the specific transform coefficient in a table, such as Table 1.

REU 228 may generate a Rice code for the specific transform coefficient based on the Rice parameter for the specific transform coefficient and a level of the specific transform coefficient (920). For example, the Rice code for the specific transform coefficient may include a prefix and a suffix separated by a fixed value which is typically equal to 0. REU 228 may determine the prefix q as x divided by M rounded down (i.e., $$q = \left\lfloor \frac{x}{M} \right\rfloor),$$

where x is a value associated with the specific transform coefficient, such as an absolute level of the specific transform coefficient or a remainder value of the specific transform coefficient, and M is equal to $2^k$, where k is the Rice parameter for the specific transform coefficient. REU 228 may determine the suffix as r=x−qM, where r is the suffix. Thus, the suffix may be considered a binary number with a length (i.e., number of bits) equal to k.

In some examples, CABAC unit 232 of entropy encoding unit 220 may perform CABAC encoding on the Rice code for the specific transform coefficient and include the resulting CABAC-encoded value in the bitstream.

Figure 10:
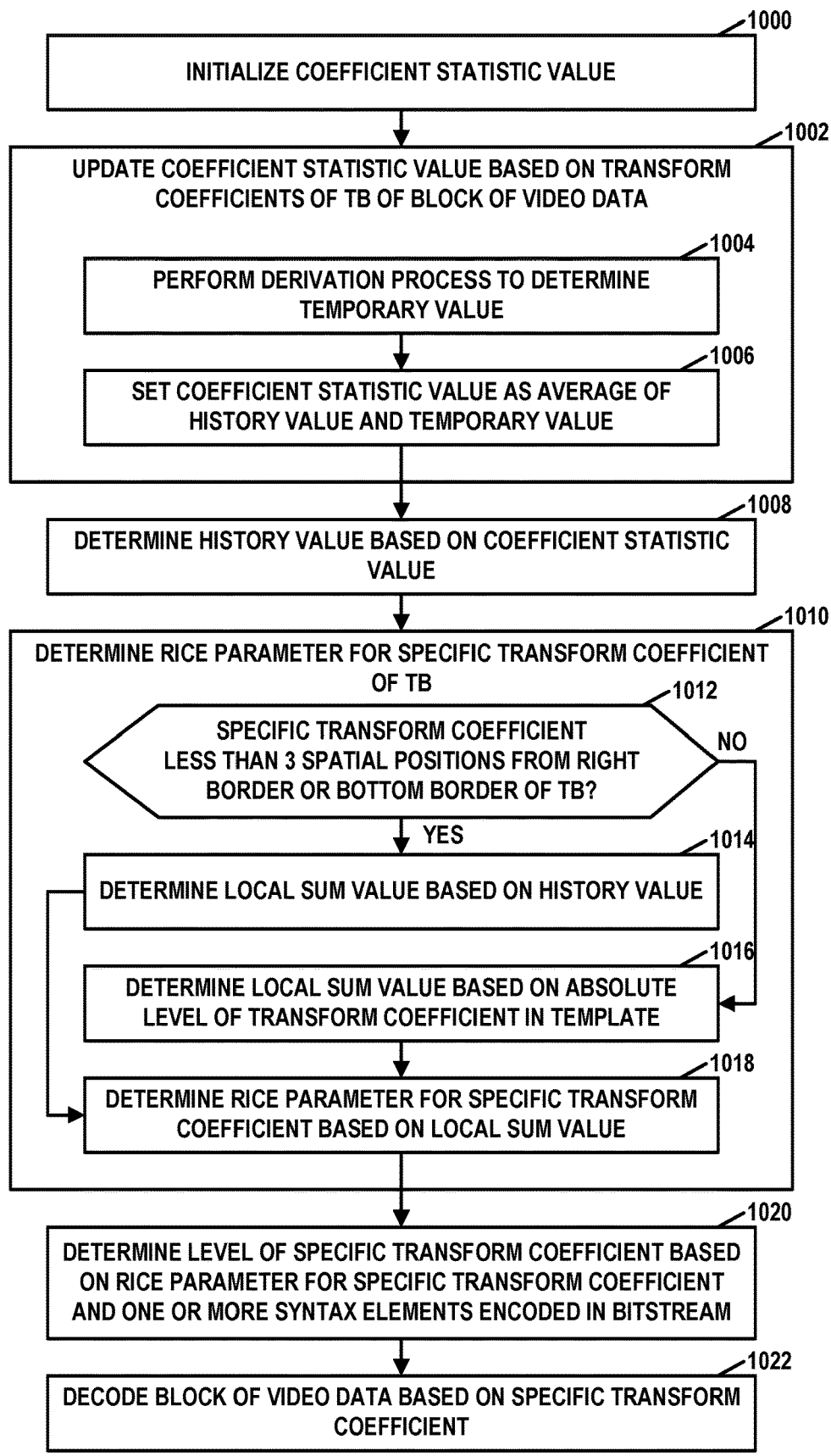
FIG. 10 is a flowchart illustrating an example process for decoding video data in accordance with one or more techniques of this disclosure.

FIG. 10 is a flowchart illustrating an example process for decoding video data in accordance with one or more techniques of this disclosure. In the example of FIG. 10, RDU 322 initializes a coefficient statistic value (e.g., statCoeff[i][compID]) (1000). For example, RDU 322 may initialize the coefficient statistic value to 0. In some examples, RDU 322 may initialize the coefficient statistic value to a default history value (e.g., DefaultHistoryRiceValue).

In some examples, RDU 322 may determine a default history value based on a QP of a slice of a picture that includes the block of the video data. For instance, where "DefaultHistoryRiceValue" indicates the default history value, "bitDepth" indicates the bit depth of the transform coefficients of a TB, and "cs.slice→getSliceQp( )" is a function that returns the QP of the slice, RDU 322 may perform the following operation to determine the default history value:

```
DefaultHistoryRiceValue = (bitDepth − 10) > 0 ? (int)(OFFSET − cs.slice->getSliceQp( )
* MULTIPLIER) : 0;
DefaultHistoryRiceValue = DefaultHistoryRiceValue < 0 ? 0 : DefaultHistoryRiceValue;
```

RDU 322 may reset the coefficient statistic value to the default history value at a start of a partitioning of the picture. For example, RDU 322 may maintain the coefficient statistic value through a certain partition of the decoded picture (e.g., full picture, slice, tile, group of CTUs, or a single CTU) with normative reset at the start of the partition.

Furthermore, in the example of FIG. 10, RDU 322 may update the coefficient statistic value based on one or more transform coefficients of a TB of a block of the video data (1002). The block of the video data may be a CU or other type of block. The one or more transform coefficient may be all of the transform coefficients of the TB or a subset of the transform coefficients of the TB. As shown in the example of FIG. 10, as part of updating the coefficient statistic value, RDU 322 may, for each respective transform coefficient of the one or more transform coefficients of the TB, perform a derivation process to determine a temporary value (1004).

The derivation process takes into consideration (i.e., is determined based at least in part on) which encoding procedure of a plurality of encoding procedures is used to encode the respective transform coefficient. The plurality of encoding procedures includes a context-based procedure for encoding the respective transform coefficient and encoding the respective transform coefficient as an absolute value. RDU 322 may perform the derivation process in accordance with any of the examples described above with respect to REU 228.

Additionally, as part of updating the coefficient statistic value, RDU 322 may set the coefficient statistic value as an average of the coefficient statistic value and the temporary value (1006). For example, tempStatCoeff[i] may indicate the temporary value and StatCoeff[i][compID] may indicate the coefficient statistic value. In this example, to set the coefficient statistic value as an average of the coefficient statistic value and the temporary value, RDU 322 may perform the following operations:

```
int averageRiceInTU = (int)(g_tempStatCoeff[i]);
StatCoeff[i][compID] = (StatCoeff[i][compID] + averageRiceInTU) >> 1;
```

Furthermore, in the example of FIG. 10, RDU 322 may determine a history value (e.g., histCoef) based on the coefficient statistic value (1008). In some examples, RDU 322 may store the coefficient statistic value as a derivative of a Rice parameter. In such examples, as part of determining the history value based on the coefficient statistic value, RDU 322 may left shift 1 by the coefficient statistic value.

For instance, RDU 322 may perform the following operations to determine the history value based on the coefficient statistic value:

```
historyRiceValue = StatCoeff[i][compID];
histCoef = 1 << historyRiceValue;
```

In another example, RDU 322 may store the coefficient statistic value as a derivative of a transform coefficient. In this example, as part of determining the history value based on the coefficient statistic value, RDU 322 may set the history value equal to the coefficient statistic value. For instance, RDU 322 may perform the following operations to determine the history value based on the coefficient statistic value:

```
historyValue = StatCoeff[i][compID];
histCoef = historyValue;
```

In the example of FIG. 10, RDU 322 may determine a Rice parameter for a specific transform coefficient of the TB (1010). The specific transform coefficient of the TB may be any of the transform coefficients of the TB. In some examples, REU 228 may determine a Rice parameter for each transform coefficient of the TB.

As part of determining the Rice parameter for the specific transform coefficient comprises, RDU 322 may determine whether the specific transform coefficient is less than 3 spatial positions from a right border or a bottom border of the TB (1012). For example, "posX" may indicate an x-axis coordinate of the specific transform coefficient, "posY" may indicate a y-axis coordinate of the specific transform coefficient, "m_width" indicate the width of the TB, "m height" may indicate the height of the TB, "sum" may indicate a local sum value, "abs(pData[ ])" indicates an absolute level of a transform coefficient, and "histCoef" indicates the history value. In this example, RDU 322 may determine whether the specific transform coefficient is less than 3 spatial positions from the right border or the bottom border of the TB using one of the following comparisons shown in Code Listing 3:

```
if (posX < m_width – 1
if (posX < m_width – 2)
if (posY < m_height – 1)
if (posY < m_height – 1)
if (posY < m_height – 2)
```

As shown in the example of FIG. 10, based on the specific transform coefficient being less than three spatial positions away from a right border of the TB or a bottom border of the TB ("YES" branch of 1012), RDU 322 may determine a local sum value based on the history value (1014). For example, as shown in Code Listing 3, RDU 328 may determine the local sum value as one of:

```
sum += histCoef
sum += N * histCoef
sum += M * histCoef
```

On the other hand, if the specific transform coefficient being not less than three spatial positions away from a right border of the TB or a bottom border of the TB ("NO" branch of 1012), RDU 322 may determine the local sum value based on a transform coefficient in a template (1016). For example, as shown in Code Listing 3, RDU 322 may determine the local sum value as one of:

```
sum += abs(pData[2]);
sum += abs(pData[m_width + 1]);
sum += abs(pData[m_width]);
sum += abs(pData[m_width << 1]);
```

Furthermore, RDU 322 may determine the Rice parameter for the specific transform coefficient based on the local sum value (1018). For example, RDU 322 may use the local sum value to look up the Rice parameter for the specific transform coefficient in a table, such as Table 1.

RDU 322 may determine a level of the specific transform coefficient based on the Rice parameter for the specific transform coefficient and one or more syntax elements encoded in the bitstream (1020). For example, a remainder syntax element (e.g., abs_remainder) or an absolute value syntax element (e.g., dec_abs_level) may indicate a Rice code for the specific transform coefficient. The Rice code for the specific transform coefficient may include a prefix q and a suffix r. The length of the suffix r may be equal to the Rice parameter for the specific transform coefficient. RDU 322 may interpret the prefix q as a unary representation of a first number, the suffix r as a binary representation of a second number, and may ignore the 0 between the prefix q and the suffix r. In this example, RDU 322 may add the first number and the second number to determine a decoded value. In examples where the specific transform coefficient is encoded using the context-based procedure, RDU 322 may determine the level of the specific transform coefficient by adding 2 to the decoded value if a greater-than-2 flag syntax element is present and equal to 1, by adding 1 to the decoded value if a greater-than-1 flag syntax element is equal to 1 and the greater-than-2 flag syntax element is equal to 0, and by setting a sign of the level of the specific transform coefficient based on a sign flag syntax element. In examples where the specific transform coefficient is encoded using an absolute value, the decoded value may be equal to the level of the specific transform coefficient or the level of the specific transform coefficient may be equal to the decoded value plus 1, depending e.g., on whether the decoded value is greater or less and a ZeroPos variable. The ZeroPos variable is described above.

In some examples, CABAC unit 324 may perform CABAC decoding on a value in the bitstream to obtain the Rice code.

Furthermore, in the example of FIG. 10, video decoder 300 may decode the block of the video data based on the level of the specific transform coefficient (1022). For example, inverse quantization unit 306 may inverse quantize the level of the specific transform coefficient, along with the values of other transform coefficients in the TB. In this example, inverse transform processing unit 308 of video decoder 300 may apply an inverse transform to the inverse quantized values of the transform coefficients of the TB to obtain residual values. (In some examples, the inverse quantization and/or inverse transform processes are omitted and the transform coefficients directly indicate the residual values.) Reconstruction unit 310 may add the residual values to corresponding samples of a prediction block. By processing each TB of the block in the manner, reconstruction unit 310 may reconstruct sample values of the block of the video data.

The following is a non-limiting list of aspects that are in accordance with one or more techniques of this disclosure.

Aspect 1A. A method of decoding video data, the method comprising: determining an estimated historic transform coefficient for a current transform coefficient; determining, based on the estimated historic transform coefficient, a local sum value; determining a Rice parameter based on the local sum value; using the Rice parameter to decode a syntax element; determining a level of the current transform coefficient based on the syntax element; and reconstructing a block of the video data based on the level of the current transform coefficient.

Aspect 2A. The method of aspect 1A, wherein determining the estimated historic transform coefficient for the current transform coefficient comprises: determining a history value for each Rice class for a region of a picture associated with the current transform unit; and determining the estimated historic transform coefficient based on the history value.

Aspect 3A. The method of aspect 2A, wherein: the region is one of a full area of the picture, a slice, a tile, a group of coding tree units (CTUs), or a single CTU; and the method further comprises resetting the history value at a start of decoding the region to a default history value.

Aspect 4A. The method of aspect 3A, further comprising determining the default history value based on a bit depth of coded data.

Aspect 5A. The method of any of aspects 3A or 4A, further comprising determining the default history value based on a quantization parameter or based on data signaled in a bitstream that includes an encoded version of the video data.

Aspect 6A. The method of any of aspects 2A through 5A, wherein determining the history value comprises: determining an average Rice parameter in a transform unit associated with the current transform coefficient; and determining the history value based on the average Rice parameter.

Aspect 7A. A method of encoding video data, the method comprising: determining an estimated historic transform coefficient for a current transform coefficient; determining, based on the estimated historic transform coefficient, a local sum value; determining a Rice parameter based on the local sum value; determining a syntax element based on a level of the current transform coefficient; and using the Rice parameter to encode the syntax element.

Aspect 8A. The method of aspect 7A, wherein determining the estimated historic transform coefficient for the current transform coefficient comprises: determining a history value for each Rice class for a region of a picture associated with the current transform unit; and determining the estimated historic transform coefficient based on the history value.

Aspect 9A. The method of aspect 8A, wherein: the region is one of a full area of the picture, a slice, a tile, a group of coding tree units (CTUs), or a single CTU; and the method further comprises resetting the history value at a start of decoding the region to a default history value.

Aspect 10A. The method of aspect 9A, further comprising determining the default history value based on a bit depth of coded data.

Aspect 11A. The method of any of aspects 9A or 10A, further comprising determining the default history value based on a quantization parameter or based on data signaled in a bitstream that includes an encoded version of the video data.

Aspect 12A. The method of any of aspects 8A through 11A, wherein determining the history value comprises: determining an average Rice parameter in a transform unit associated with the current transform coefficient; and determining the history value based on the average Rice parameter.

Aspect 13A. A device for coding video data, the device comprising one or more means for performing the method of any of aspects 1A-12A.

Aspect 14A. The device of aspect 13A, wherein the one or more means comprise one or more processors implemented in circuitry.

Aspect 15A. The device of any of aspects 13A and 14A, further comprising a memory to store the video data.

Aspect 16A. The device of any of aspects 13A-15A, further comprising a display configured to display decoded video data.

Aspect 17A. The device of any of aspects 13A-16A, wherein the device comprises one or more of a camera, a computer, a mobile device, a broadcast receiver device, or a set-top box.

Aspect 18A. The device of any of aspects 13A-17A, wherein the device comprises a video decoder.

Aspect 19A. The device of any of aspects 13A-18A, wherein the device comprises a video encoder.

Aspect 20A. A computer-readable storage medium having stored thereon instructions that, when executed, cause one or more processors to perform the method of any of aspects 1A-12A.

Aspect 1B: A method of decoding video data includes initializing a coefficient statistic value; updating the coefficient statistic value based on one or more transform coefficients of a transform block (TB) of a block of the video data, wherein updating the coefficient statistic value comprises, for each respective transform coefficient of the one or more transform coefficients of the TB: performing a derivation process to determine a temporary value, wherein the derivation process is determined based at least in part on which encoding method of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; determining a level of the specific transform coefficient based on the Rice parameter for the specific transform coefficient and one or more syntax elements encoded in a bitstream; and decoding the block based on the level of the specific transform coefficient.

Aspect 2B: The method of aspect 1B, wherein performing the derivation process to determine the temporary value comprises: based on the respective transform coefficient being encoded using the context-based procedure, determining the temporary value based on applying a floor function to a log-base-2 value of a remainder value of the respective transform coefficient, and adding an integer value.

Aspect 3B: The method of aspect 1B, wherein performing the derivation process to determine the temporary value comprises: based on the respective transform coefficient being encoded as an absolute value, determining the temporary value based on applying a floor function to a log-base-2 value of an absolute level of the respective transform coefficient.

Aspect 4B: The method of aspect 1B, further includes determining a default history value based on a quantization parameter (QP) of a slice of a picture that includes the TB; and resetting the coefficient statistic value to the default history value at a start of a partitioning of the picture.

Aspect 5B: The method of aspect 1B, wherein: the method further comprises storing the coefficient statistic value as a Rice parameter derivative, and determining the history value based on the coefficient statistic value comprises left-shifting 1 by the coefficient statistic value.

Aspect 6B: A method of encoding video data includes initializing a coefficient statistic value; updating the coefficient statistic value based on one or more transform coefficients of a transform block (TB) of the video data, wherein updating the coefficient statistic value comprises, for each respective transform coefficient of the one or more transform coefficients of the TB: performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; and generating a Rice code for the specific transform coefficient based on the Rice parameter for the specific transform coefficient and a level of the specific transform coefficient.

Aspect 7B: The method of aspect 6B, wherein performing the derivation process to determine the temporary value comprises: based on the respective transform coefficient being encoded using the context-based procedure, determining the temporary value based on applying a floor function to a log-base-2 value of a remainder value of the respective transform coefficient, and adding an integer value.

Aspect 8B: The method of aspect 6B, wherein performing the derivation process to determine the temporary value comprises: based on the respective transform coefficient being encoded as an absolute value, determining the temporary value based on applying a floor function to a log-base-2 value of an absolute level of the respective transform coefficient.

Aspect 9B: The method of aspect 6B, further includes determining a default history value based on a quantization parameter (QP) of a slice of a picture that includes the TB; and resetting the coefficient statistic value to the default history value at a start of a partitioning of the picture.

Aspect 10B: The method of aspect 6B, wherein: the method further comprises storing the coefficient statistic value as a Rice parameter derivative, and determining the history value based on the coefficient statistic value comprises left-shifting 1 by the coefficient statistic value.

Aspect 11B: A device for decoding video data includes a memory configured to store the video data; and processing circuitry configured to: initialize a coefficient statistic value; update the coefficient statistic value based on one or more transform coefficients of a transform block (TB) of a block of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; determine a level of the specific transform coefficient based on the Rice parameter for the specific transform coefficient; and decode the block based on the level of the specific transform coefficient.

Aspect 12B: The device of aspect 11B, wherein the processing circuitry is configured to, as part of performing the derivation process to determine the temporary value: based on the respective transform coefficient being encoded using the context-based procedure, determining the temporary value based on applying a floor function to a log-base-2 value of a remainder value of the respective transform coefficient, and adding an integer value; and based on the respective transform coefficient being encoded as an absolute value, determining the temporary value based on applying a floor function to a log-base-2 value of an absolute level of the respective transform coefficient.

Aspect 13B: The device of aspect 11B, wherein the processing circuitry is further configured to: determine a default history value based on a quantization parameter (QP) of a slice of a picture that includes the TB; and reset the coefficient statistic value to the default history value at a start of a partitioning of the picture.

Aspect 14B: The device of aspect 11B, wherein: the processing circuitry is further configured to store the coefficient statistic value as a Rice parameter derivative, and the processing circuitry is configured to, as part of determining the history value based on the coefficient statistic value, left shift 1 by the coefficient statistic value.

Aspect 15B: The device of aspect 11B, further comprising a display configured to display decoded video data.

Aspect 16B: The device of aspect 11B, wherein the device comprises one or more of a camera, a computer, a mobile device, a broadcast receiver device, or a set-top box.

Aspect 17B: A device for encoding video data includes a memory configured to store the video data; and processing circuitry configured to: initialize a coefficient statistic value; update the coefficient statistic value based on one or more transform coefficients of a transform block (TB) of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; and generate a Rice code for the specific transform coefficient based on the Rice parameter for the specific transform coefficient and a level of the specific transform coefficient.

Aspect 18B: The device of aspect 17B, wherein the processing circuitry is configured to, as part of performing the derivation process to determine the temporary value: based on the respective transform coefficient being encoded using the context-based procedure, determining the temporary value based on applying a floor function to a log-base-2 value of a remainder value of the respective transform coefficient, and adding an integer value; and based on the respective transform coefficient being encoded as an absolute value, determining the temporary value based on applying a floor function to a log-base-2 value of an absolute level of the respective transform coefficient.

Aspect 19B: The device of aspect 17B, wherein the processing circuitry is further configured to: determine a default history value based on a quantization parameter (QP) of a slice of a picture that includes the TB; and reset the coefficient statistic value to the default history value at a start of a partitioning of the picture.

Aspect 20B: The device of aspect 17B, wherein: the processing circuitry is further configured to store the coefficient statistic value as a Rice parameter derivative, and the processing circuitry is configured to, as part of determining the history value based on the coefficient statistic value, left shift 1 by the coefficient statistic value.

Aspect 21B: The device of aspect 17B, wherein the device comprises one or more of a camera, a computer, a mobile device, a broadcast receiver device, or a set-top box.

Aspect 1C: A method of decoding video data includes initializing a coefficient statistic value; updating the coefficient statistic value based on one or more transform coefficients of a transform block (TB) of a block of the video data, wherein updating the coefficient statistic value comprises, for each respective transform coefficient of the one or more transform coefficients of the TB: performing a derivation process to determine a temporary value, wherein the derivation process is determined based at least in part on which encoding method of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; determining a level of the specific transform coefficient based on the Rice parameter for the specific transform coefficient and one or more syntax elements encoded in a bitstream; and decoding the block based on the level of the specific transform coefficient.

Aspect 2C: The method of aspect 1C, wherein performing the derivation process to determine the temporary value comprises: based on the respective transform coefficient being encoded using the context-based procedure, determining the temporary value based on applying a floor function to a log-base-2 value of a remainder value of the respective transform coefficient, and adding an integer value.

Aspect 3C: The method of aspect 1C, wherein performing the derivation process to determine the temporary value comprises: based on the respective transform coefficient being encoded as an absolute value, determining the temporary value based on applying a floor function to a log-base-2 value of an absolute level of the respective transform coefficient.

Aspect 4C: The method of any of aspects 1C through 3C, further includes determining a default history value based on a quantization parameter (QP) of a slice of a picture that includes the TB; and resetting the coefficient statistic value to the default history value at a start of a partitioning of the picture.

Aspect 5C: The method of any of aspects 1C through 4C, wherein: the method further comprises storing the coefficient statistic value as a Rice parameter derivative, and determining the history value based on the coefficient statistic value comprises left-shifting 1 by the coefficient statistic value.

Aspect 6C: A method of encoding video data includes initializing a coefficient statistic value; updating the coefficient statistic value based on one or more transform coefficients of a transform block (TB) of the video data, wherein updating the coefficient statistic value comprises, for each respective transform coefficient of the one or more transform coefficients of the TB: performing a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and setting the coefficient statistic value as an average of the coefficient statistic value and the temporary value; determining a history value based on the coefficient statistic value; determining a Rice parameter for a specific transform coefficient of the TB, wherein determining the Rice parameter for the specific transform coefficient comprises: based on the specific transform coefficient being less than three spatial positions away from a right border of the TB or a bottom border of the TB, determining a local sum value based on the history value; and determining the Rice parameter for the specific transform coefficient based on the local sum value; and generating a Rice code for the specific transform coefficient based on the Rice parameter for the specific transform coefficient and a level of the specific transform coefficient.

Aspect 7C: The method of aspect 6C, wherein performing the derivation process to determine the temporary value comprises: based on the respective transform coefficient being encoded using the context-based procedure, determining the temporary value based on applying a floor function to a log-base-2 value of a remainder value of the respective transform coefficient, and adding an integer value.

Aspect 8C: The method of aspect 6C, wherein performing the derivation process to determine the temporary value comprises: based on the respective transform coefficient being encoded as an absolute value, determining the temporary value based on applying a floor function to a log-base-2 value of an absolute level of the respective transform coefficient.

Aspect 9C: The method of any of aspects 6C through 8C, further includes determining a default history value based on a quantization parameter (QP) of a slice of a picture that includes the TB; and resetting the coefficient statistic value to the default history value at a start of a partitioning of the picture.

Aspect 10C: The method of any of aspects 6C through 9C, wherein: the method further comprises storing the coefficient statistic value as a Rice parameter derivative, and determining the history value based on the coefficient statistic value comprises left-shifting 1 by the coefficient statistic value.

Aspect 11C: A device for decoding video data includes a memory configured to store the video data; and processing circuitry configured to: initialize a coefficient statistic value; update the coefficient statistic value based on one or more transform coefficients of a transform block (TB) of a block of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; determine a level of the specific transform coefficient based on the Rice parameter for the specific transform coefficient; and decode the block based on the level of the specific transform coefficient.

Aspect 12C: The device of aspect 11C, wherein the processing circuitry is configured to, as part of performing the derivation process to determine the temporary value: based on the respective transform coefficient being encoded using the context-based procedure, determining the temporary value based on applying a floor function to a log-base-2 value of a remainder value of the respective transform coefficient, and adding an integer value; and based on the respective transform coefficient being encoded as an absolute value, determining the temporary value based on applying a floor function to a log-base-2 value of an absolute level of the respective transform coefficient.

Aspect 13C: The device of any of aspects 11C and 12C, wherein the processing circuitry is further configured to: determine a default history value based on a quantization parameter (QP) of a slice of a picture that includes the TB; and reset the coefficient statistic value to the default history value at a start of a partitioning of the picture.

Aspect 14C: The device of any of aspects 11C through 13C, wherein: the processing circuitry is further configured to store the coefficient statistic value as a Rice parameter derivative, and the processing circuitry is configured to, as part of determining the history value based on the coefficient statistic value, left shift 1 by the coefficient statistic value.

Aspect 15C: The device of any of aspects 11C through 14C, further comprising a display configured to display decoded video data.

Aspect 16C: The device of any of aspects 11C through 15C, wherein the device comprises one or more of a camera, a computer, a mobile device, a broadcast receiver device, or a set-top box.

Aspect 17C: A device for encoding video data includes a memory configured to store the video data; and processing circuitry configured to: initialize a coefficient statistic value; update the coefficient statistic value based on one or more transform coefficients of a transform block (TB) of the video data, wherein the processing circuitry is configured to, as part of updating the coefficient statistic value, for each respective transform coefficient of the one or more transform coefficients of the TB: perform a derivation process to determine a temporary value, wherein the derivation process is determined based at least in part on which encoding procedure of a plurality of encoding procedures is used to encode the respective transform coefficient, the plurality of encoding procedures including a context-based procedure for encoding the respective transform coefficient and encoding the respective transform coefficient as an absolute value; and set the coefficient statistic value as an average of the coefficient statistic value and the temporary value; determine a history value based on the coefficient statistic value; determine a Rice parameter for a specific transform coefficient of the TB, wherein the processing circuitry is configured to, as part of determining the Rice parameter for the specific transform coefficient: based on the specific transform coefficient being less than three spatial positions away from a right border of the TB or a bottom border of the TB, determine a local sum value based on the history value; and determine the Rice parameter for the specific transform coefficient based on the local sum value; and generate a Rice code for the specific transform coefficient based on the Rice parameter for the specific transform coefficient and a level of the specific transform coefficient.

Aspect 18C: The device of aspect 17C, wherein the processing circuitry is configured to, as part of performing the derivation process to determine the temporary value: based on the respective transform coefficient being encoded using the context-based procedure, determining the temporary value based on applying a floor function to a log-base-2 value of a remainder value of the respective transform coefficient, and adding an integer value; and based on the respective transform coefficient being encoded as an absolute value, determining the temporary value based on applying a floor function to a log-base-2 value of an absolute level of the respective transform coefficient.

Aspect 19C: The device of any of aspects 17C and 18C, wherein the processing circuitry is further configured to: determine a default history value based on a quantization parameter (QP) of a slice of a picture that includes the TB; and reset the coefficient statistic value to the default history value at a start of a partitioning of the picture.

Aspect 20C: The device of any of aspects 17C through 19C, wherein: the processing circuitry is further configured to store the coefficient statistic value as a Rice parameter derivative, and the processing circuitry is configured to, as part of determining the history value based on the coefficient statistic value, left shift 1 by the coefficient statistic value.

Aspect 21C: The device of any of aspects 17C through 20C, wherein the device comprises one or more of a camera, a computer, a mobile device, a broadcast receiver device, or a set-top box.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the terms "processor" and "processing circuitry," as used herein may refer to any of the foregoing structures or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding video data, the method comprising:
   determining a default history value based on a bit depth of a slice of a picture that includes a first transform block (TB) and a second TB; and
   resetting a coefficient statistic value to the default history value at a start of a partitioning of the picture
   updating the coefficient statistic value based on one or more transform coefficients of the first TB, wherein updating the coefficient statistic value comprises, for each respective transform coefficient of the one or more transform coefficients of the first TB:
      performing a derivation process to determine a temporary value, wherein the derivation process is determined based at least in part on which encoding process of a plurality of encoding processes is used to encode the respective transform coefficient, the plurality of encoding processes including a context-based process for encoding the respective transform coefficient and encoding the respective transform coefficient as an absolute value; and
      setting the coefficient statistic value as an average of the coefficient statistic value and the temporary value;
   determining a history value based on the coefficient statistic value;
   determining a Rice parameter for a specific transform coefficient of the second TB based on the history value;
   determining a level of the specific transform coefficient based on the Rice parameter for the specific transform coefficient and one or more syntax elements encoded in a bitstream; and
   decoding a block of the video data based on the level of the specific transform coefficient.

2. The method of claim 1, wherein determining the Rice parameter for the specific transform coefficient comprises:

based on the specific transform coefficient being less than three spatial positions away from a right border of the second TB or a bottom border of the second TB, determining a local sum value based on the history value; and determining the Rice parameter for the specific transform coefficient based on the local sum value.

3. The method of claim 1, wherein performing the derivation process to determine the temporary value comprises:
based on the respective transform coefficient being encoded using the context-based process, determining the temporary value based on applying a floor function to a log-base-2 value of a remainder value of the respective transform coefficient, and adding an integer value.

4. The method of claim 1, wherein performing the derivation process to determine the temporary value comprises:
based on the respective transform coefficient being encoded as an absolute value, determining the temporary value based on applying a floor function to a log-base-2 value of an absolute level of the respective transform coefficient.

5. The method of claim 1, wherein the method of decoding is performed as part of an encoding process.

6. A device for decoding video data, the device comprising:
a memory configured to store video data;
one or more processors implemented in circuitry and configured to:
determine a default history value based on a bit depth of a slice of a picture that includes a first transform block (TB) and a second TB; and
reset a coefficient statistic value to the default history value at a start of a partitioning of the picture;
update the coefficient statistic value based on one or more transform coefficients of the first TB, wherein to update the coefficient statistic value, the one or more processors are further configured to, for each respective transform coefficient of the one or more transform coefficients of the first TB:
perform a derivation process to determine a temporary value, wherein the derivation process is determined based at least in part on which encoding process of a plurality of encoding processes is used to encode the respective transform coefficient, the plurality of encoding processes including a context-based process for encoding the respective transform coefficient and encoding the respective transform coefficient as an absolute value; and
set the coefficient statistic value as an average of the coefficient statistic value and the temporary value;
determine a history value based on the coefficient statistic value;
determine a Rice parameter for a specific transform coefficient of the second TB based on the history value;
determine a level of the specific transform coefficient based on the Rice parameter for the specific transform coefficient and one or more syntax elements encoded in a bitstream; and
decode a block of the video data based on the level of the specific transform coefficient.

7. The device of claim 6, wherein to determine the Rice parameter for the specific transform coefficient, the one or more processors are further configured to:

based on the specific transform coefficient being less than three spatial positions away from a right border of the second TB or a bottom border of the second TB, determine a local sum value based on the history value; and determine the Rice parameter for the specific transform coefficient based on the local sum value.

8. The device of claim 6, wherein to perform the derivation process to determine the temporary value, the one or more processors are further configured to:
based on the respective transform coefficient being encoded using the context-based process, determine the temporary value based on applying a floor function to a log-base-2 value of a remainder value of the respective transform coefficient, and adding an integer value.

9. The device of claim 6, wherein to perform the derivation process to determine the temporary value, the one or more processors are further configured to:
based on the respective transform coefficient being encoded as an absolute value, determine the temporary value based on applying a floor function to a log-base-2 value of an absolute level of the respective transform coefficient.

10. The device of claim 6, wherein the device comprises a video decoder.

11. The device of claim 6, wherein the device comprises a video encoder.

12. The device of claim 6, wherein the device comprises a wireless communication device, further comprising a receiver configured to receive the video data.

13. The device of claim 12, wherein the wireless communication device comprises a telephone handset and wherein the receiver is configured to demodulate, according to a wireless communication standard, a signal comprising the video data.

14. The device of claim 6, wherein the device comprises one or more of a camera, a computer, a mobile device, a broadcast receiver device, or a set-top box.

15. The device of claim 6, further comprising a display configured to display decoded video data.

16. The device of claim 6, wherein the device comprises a wireless communication device comprising a receiver configured to receive the video data.

17. A computer-readable storage medium storing instructions that when executed by one or more processors cause the one or more processors to:
determine a default history value based on a bit depth of a slice of a picture that includes a first transform block (TB) and a second TB; and
reset a coefficient statistic value to the default history value at a start of a partitioning of the picture;
update the coefficient statistic value based on one or more transform coefficients of the first TB, wherein to update the coefficient statistic value, the instructions cause the one or more processors to, for each respective transform coefficient of the one or more transform coefficients of the first TB:
perform a derivation process to determine a temporary value, wherein the derivation process is determined based at least in part on which encoding process of a plurality of encoding processes is used to encode the respective transform coefficient, the plurality of encoding processes including a context-based process for encoding the respective transform coefficient and encoding the respective transform coefficient as an absolute value; and set the coefficient statistic value as an average of the coefficient statistic value and the temporary value;

determine a history value based on the coefficient statistic value;

determine a Rice parameter for a specific transform coefficient of the second TB based on the history value;

determine a level of the specific transform coefficient based on the Rice parameter for the specific transform coefficient and one or more syntax elements encoded in a bitstream; and decode a block of video data based on the level of the specific transform coefficient.

18. The computer-readable storage medium of claim 17, wherein to determine the Rice parameter for the specific transform coefficient, the instructions cause the one or more processors to:

based on the specific transform coefficient being less than three spatial positions away from a right border of the second TB or a bottom border of the second TB, determine a local sum value based on the history value; and determine the Rice parameter for the specific transform coefficient based on the local sum value.

19. The computer-readable storage medium of claim 17, wherein to perform the derivation process to determine the temporary value, the instructions cause the one or more processors to:

based on the respective transform coefficient being encoded using the context-based process, determine the temporary value based on applying a floor function to a log-base-2 value of a remainder value of the respective transform coefficient, and adding an integer value.

20. The computer-readable storage medium of claim 17, wherein to perform the derivation process to determine the temporary value, the instructions cause the one or more processors to:

based on the respective transform coefficient being encoded as an absolute value, determine the temporary value based on applying a floor function to a log-base-2 value of an absolute level of the respective transform coefficient.

* * * * *